(12) United States Patent
Lee et al.

(10) Patent No.: US 10,998,053 B2
(45) Date of Patent: May 4, 2021

(54) MEMORY DEVICE AND OPERATING METHOD THEREOF FOR APPLYING A CHANNEL PRECHARGE VOLTAGE TO BIT LINES AFTER A SENSING OPERATION

(71) Applicant: SK hynix Inc., Icheon-si (KR)

(72) Inventors: Jung Hwan Lee, Osan-si (KR); Jung Mi Ko, Icheon-si (KR); Ji Hwan Kim, Seoul (KR); Kwang Ho Baek, Icheon-si (KR); Young Don Jung, Suwon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 16/676,157

(22) Filed: Nov. 6, 2019

(65) Prior Publication Data

US 2020/0321042 A1    Oct. 8, 2020

(30) Foreign Application Priority Data

Apr. 8, 2019   (KR) .......................... 10-2019-0041022

(51) Int. Cl.
    *G11C 7/12*       (2006.01)
    *G11C 16/24*      (2006.01)
    (Continued)

(52) U.S. Cl.
    CPC ................ *G11C 16/24* (2013.01); *G11C 7/12* (2013.01); *G11C 16/0483* (2013.01);
    (Continued)

(58) Field of Classification Search
    CPC . G11C 16/0483; G11C 16/3427; G11C 16/26; G11C 16/08; G11C 16/30; G11C 16/16; G11C 16/24
    See application file for complete search history.

(56) References Cited

U.S. PATENT DOCUMENTS

| 8,737,140 B2 * | 5/2014 | Kim ....................... G11C 16/14 365/185.25 |
| 9,679,660 B1 * | 6/2017 | Bae ........................ G11C 16/08 |

(Continued)

FOREIGN PATENT DOCUMENTS

| KR | 1020150001400 A | 1/2015 |
| KR | 1020160107089 A | 9/2016 |

*Primary Examiner* — Mushfique Siddique
(74) *Attorney, Agent, or Firm* — William Park & Associates Ltd.

(57) ABSTRACT

A memory device includes: a memory block, coupled to a plurality of word lines; a peripheral circuit for performing a sensing operation on selected memory cells of the memory block, the select memory cells being coupled to a selected word line of the plurality of word lines; a word line voltage controller for controlling a sensing voltage applied to the selected word line to perform the sensing operation on the selected memory cells and configured to control a pass voltage applied to the selected word line and unselected word lines of the plurality of word lines, coupled to the memory block; and a bit line control signal generator for controlling the peripheral circuit to apply a channel pre-charge voltage to respective bit lines, coupled to the selected memory cells, while the pass voltage is being applied to the selected word line and the unselected word lines.

19 Claims, 14 Drawing Sheets

(51) Int. Cl.
*G11C 16/04* (2006.01)
*G11C 16/34* (2006.01)
*G11C 16/26* (2006.01)
*G11C 16/30* (2006.01)
*G11C 16/08* (2006.01)
*G11C 16/16* (2006.01)
*G11C 8/08* (2006.01)

(52) U.S. Cl.
CPC .............. *G11C 16/08* (2013.01); *G11C 16/16* (2013.01); *G11C 16/26* (2013.01); *G11C 16/30* (2013.01); *G11C 16/3427* (2013.01); *G11C 8/08* (2013.01)

(56) References Cited

U.S. PATENT DOCUMENTS

| | | | | |
|---|---|---|---|---|
| 2016/0148690 A1* | 5/2016 | An | ........................ | G11C 16/26 365/185.11 |
| 2016/0260489 A1* | 9/2016 | Lee | .................... | G11C 16/3427 |
| 2017/0323685 A1* | 11/2017 | Lee | .......................... | G11C 7/24 |
| 2018/0247688 A1* | 8/2018 | Lee | ........................ | G11C 16/08 |
| 2018/0247697 A1* | 8/2018 | Lee | ........................ | G11C 16/10 |
| 2019/0147964 A1* | 5/2019 | Yun | .................... | G11C 16/3459 365/185.22 |

* cited by examiner

MEMORY DEVICE AND OPERATING METHOD THEREOF FOR APPLYING A CHANNEL PRECHARGE VOLTAGE TO BIT LINES AFTER A SENSING OPERATION

CROSS-REFERENCE TO RELATED APPLICATION

The present application claims priority under 35 U.S.C. § 119(a) to Korean patent application 10-2019-0041022, filed on Apr. 8, 2019 in the Korean Intellectual Property Office, the entire disclosure of which is incorporated herein by reference.

BACKGROUND

1. Technical Field

The present disclosure generally relates to an electronic device, and more particularly, to a memory device and an operating method thereof.

2. Related Art

A storage device is configured to store data. The storage device is a device under the control of a host device, such as a computer, a smart phone, or a smart pad. The storage device includes a device configured to store data on a magnetic disk, such as a Hard Disk Drive (HDD), and a device configured to store data on a semiconductor memory, i.e., a nonvolatile memory, such as a Solid State Drive (SSD) or a memory card.

The storage device may include a memory device configured to store data and a memory controller configured to control the memory device. The memory device is classified into a volatile memory device and a nonvolatile memory device. The nonvolatile memory device includes a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

The memory device may perform a program operation, a read operation or an erase operation. The memory device may perform a verify operation or read operation after a program operation. When a sensing operation is completed, an equalizing operation may be performed in the memory device. The equalizing operation may be an operation for discharging word lines and bit lines. In the equalizing operation, the potential of a channel may be changed to a negative value. Since the potential of the channel becomes 0V through the equalizing operation, a disturb phenomenon may occur.

SUMMARY

In accordance with an aspect of the present disclosure, there is provided a memory device including: a memory block, coupled to a plurality of word lines; a peripheral circuit configured to perform a sensing operation on selected memory cells of the memory block, the selected memory cells being coupled to a selected word line of the plurality of word lines; a word line voltage controller configured to control a sensing voltage applied to the selected word line to perform the sensing operation on the selected memory cells and configured to control a pass voltage applied to the selected word line and unselected word lines of the plurality of word lines, coupled to the memory block; and a bit line control signal generator configured to control the peripheral circuit to apply a channel precharge voltage to respective bit lines, coupled to the selected memory cells, while the pass voltage is being applied to the selected word line and the unselected word lines.

In accordance with another aspect of the present disclosure, there is provided a method for operating a memory device including a memory block, coupled to a plurality of word lines, the method including: performing a sensing operation by applying a sensing voltage to a selected word line of the plurality of word lines and applying a pass voltage to unselected word lines; and performing a channel precharge operation by applying the pass voltage to the selected word line and applying a channel precharge voltage to bit lines that are coupled to memory cells, the memory cells being coupled to the selected word line.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
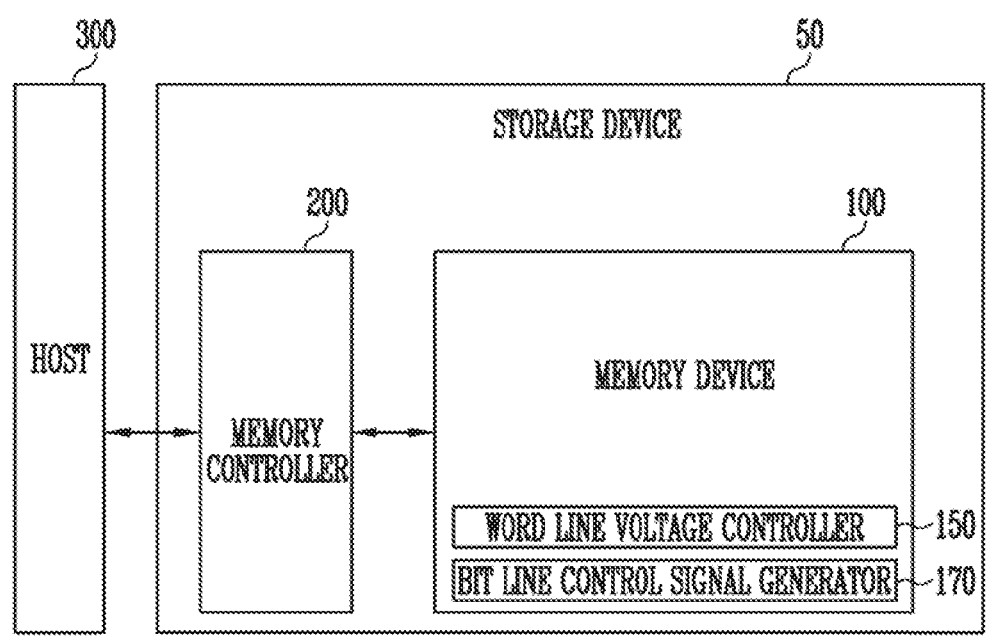
FIG. 1 is a block diagram, illustrating a storage device.

The specific structural or functional description disclosed herein is merely illustrative for the purpose of describing embodiments based on the concept of the present disclosure. The embodiments based on the concept of the present disclosure can be implemented in various forms, and cannot be construed as limited to the embodiments set forth herein.

The embodiments based on the concept of the present disclosure can be variously modified and have various shapes. Thus, the embodiments are illustrated in the drawings and are intended to be described herein in detail. However, the embodiments based on the concept of the present disclosure are not construed as limited to specified disclosures, and include all changes, equivalents, or substitutes that do not depart from the spirit and technical scope of the present disclosure.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately~between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise.

So far as not being differently defined, all terms used herein including technical or scientific terminologies have meanings that they are commonly understood by those skilled in the art to which the present disclosure pertains.

In describing those embodiments, description will be omitted for techniques that are well known to the art to which the present disclosure pertains, and are not directly related to the present disclosure.

Hereinafter, exemplary embodiments of the present disclosure will be described in detail with reference to the accompanying drawings in order for those skilled in the art to be able to readily implement the technical spirit of the present disclosure.

Embodiments provide a memory device for applying a channel precharge voltage to a bit line to precharge a channel of a memory cell after a sensing operation, and an operating method of the memory device.

FIG. 1 is a block diagram, illustrating a storage device.

Referring to FIG. 1, the storage device 50 may include a memory device 100 and a memory controller 200.

The storage device 50, under the control of a host 300, may be a device for storing data. For example, the storage device 50 may be a mobile phone, a smart phone, an MP3 player, a laptop computer, a desktop computer, a game console, a TV, a tablet PC or an in-vehicle infotainment.

The storage device 50 may be manufactured as any one of various types of storage devices based on a host interface that is a communication scheme with the host 300.

The storage device 50 may be manufactured as any one of various kinds of package types.

The memory device 100 may store data. The memory device 100 operates under the control of the memory controller 200. The memory device 100 may include a memory cell array including a plurality of memory cells for storing data.

The memory cell array may include a plurality of memory blocks. Each memory block may include a plurality of memory cells. One memory block may include a plurality of pages. In an embodiment, the page may be the unit for storing data in the memory device 100 or reading data stored in the memory device 100. The memory block may be the unit for erasing data.

In an embodiment, the memory device 100 may be a nonvolatile memory. In this specification, for convenience of description, the memory device 100 may be a NAND flash memory.

In an embodiment, the memory device 100 may be implemented in a three-dimensional array structure. The present disclosure may be applied not only to a flash memory device in which a charge storage layer is configured with a Floating Gate (FG), but also to a Charge Trap Flash (CTF) in which a charge storage layer is configured with an insulating layer.

In an embodiment, each of the memory cells included in the memory device 100 may be configured as a Single Level Cell (SLC) for storing one data bit. However, in another embodiment, each of the memory cells included in the memory device 100 may be configured as a Multi-Level Cell (MLC) for storing two data bits, a Triple Level Cell (TLC) for storing three data bits, or a Quad Level Cell (QLC) for storing four data bits.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory device 100 may include a word line voltage controller 150. In an embodiment, the word line voltage controller 150 may control a voltage applied to a word line. The word line may be any one of a plurality of word lines coupled to a memory block. Therefore, the voltage applied to the word line may be a program voltage, a read voltage, a verify voltage or a pass voltage.

Specifically, in a sensing operation, the word line voltage controller 150 may control a sensing voltage to be applied to a selected word line of the plurality of word lines, and control a pass voltage to be applied to unselected word lines of the plurality of word lines. The sensing operation may be a read operation or verify operation, and the sensing voltage may be a read voltage or verify voltage.

Subsequently, the word line voltage controller 150 may control a voltage applied to the plurality of word lines so as to perform an equalizing operation. The equalizing operation may be an operation for equalizing the times at which the plurality of word lines is discharged. Therefore, in order to perform the equalizing operation, the word line voltage controller 150 may apply a pass voltage to the selected word line, and apply the pass voltage to the unselected word lines until the pass voltage is applied to the selected word line. When the pass voltage is applied to all of the plurality of word lines, the plurality of word lines is discharged.

The memory device 100 may include a bit line control signal generator 170. The bit line control signal generator 170 may generate control signals for controlling the voltage applied to a bit line.

In an embodiment, page buffers are coupled to respective bit lines, the bit lines being coupled to memory cells, which are coupled to a word line. The page buffer may include a plurality of transistors. The bit line control signal generator 170 may generate control signals to turn on or turn off the plurality of transistors. The bit line control signal generator 170 may control the voltage applied to the bit line through the control signals.

The memory controller 200 may control the overall operations of the storage device 50.

When power is applied to the storage device 50, the memory controller 200 may execute firmware (FW). When the memory device 100 is a flash memory device, the memory controller 200 may execute FW such as an Flash Translation Layer (FTL) for controlling communication between the host 300 and the memory device 100.

In an embodiment, the memory controller 200 may receive data and a Logical Block Address (LBA), from the host 300, and translate the LBA into a Physical Block Address (PBA). The PBA may represent addresses of memory cells included in the memory device 100, in which data is to be stored. Furthermore, the memory controller 200 may store, in a buffer memory (not shown), a logical-physical address mapping table that establishes a mapping relationship between the LBA and the PBA.

The memory controller 200 may control the memory device 100 to perform a program operation, a read operation, an erase operation, or the like, in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a program command, an address, and data without any request from the host 300, and transmit the program command, the address, and the data to the memory device 100. For example, the memory controller 200 may provide the command, the address, and the data to the memory device 100 to perform background operations, such as a program operation for wear leveling and a program operation for garbage collection.

In an embodiment, the memory controller 200 may control data exchange between the host 300 and the buffer memory. Alternatively, the memory controller 200 may temporarily store system data for controlling the memory device 100 in the buffer memory. For example, the memory controller 200 may temporarily store data input from the host 300 in the buffer memory, and then transmit the data temporarily stored in the buffer memory to the memory device 100.

In various embodiments, the buffer memory may be used as a working memory or cache memory of the memory controller 200. The buffer memory may store codes or commands executed by the memory controller 200. Alternatively, the buffer memory may store data processed by the memory controller 200.

In an embodiment, the buffer memory may be implemented with a Dynamic Random Access Memory (DRAM) such as a Double Data Rate Synchronous DRAM (DDR SDRAM), a DDR4 SDRAM, a Low Power Double Data Rate 4 (LPDDR4) SDRAM, a Graphics Double Data Rate (GDDR) SRAM, a Low Power DDR (LPDDR), or a Rambus Dynamic Random Access Memory (RDRAM), or a Static Random Access Memory (SRAM).

In various embodiments, the storage device 50 might not include the buffer memory. Therefore, volatile memory devices 100, outside of the storage device 50, may perform functions of the buffer memory.

In an embodiment, the memory controller 200 may control at least two memory devices 100. The memory controller 200 may control the memory devices based on an interleaving scheme so as to improve operational performance.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
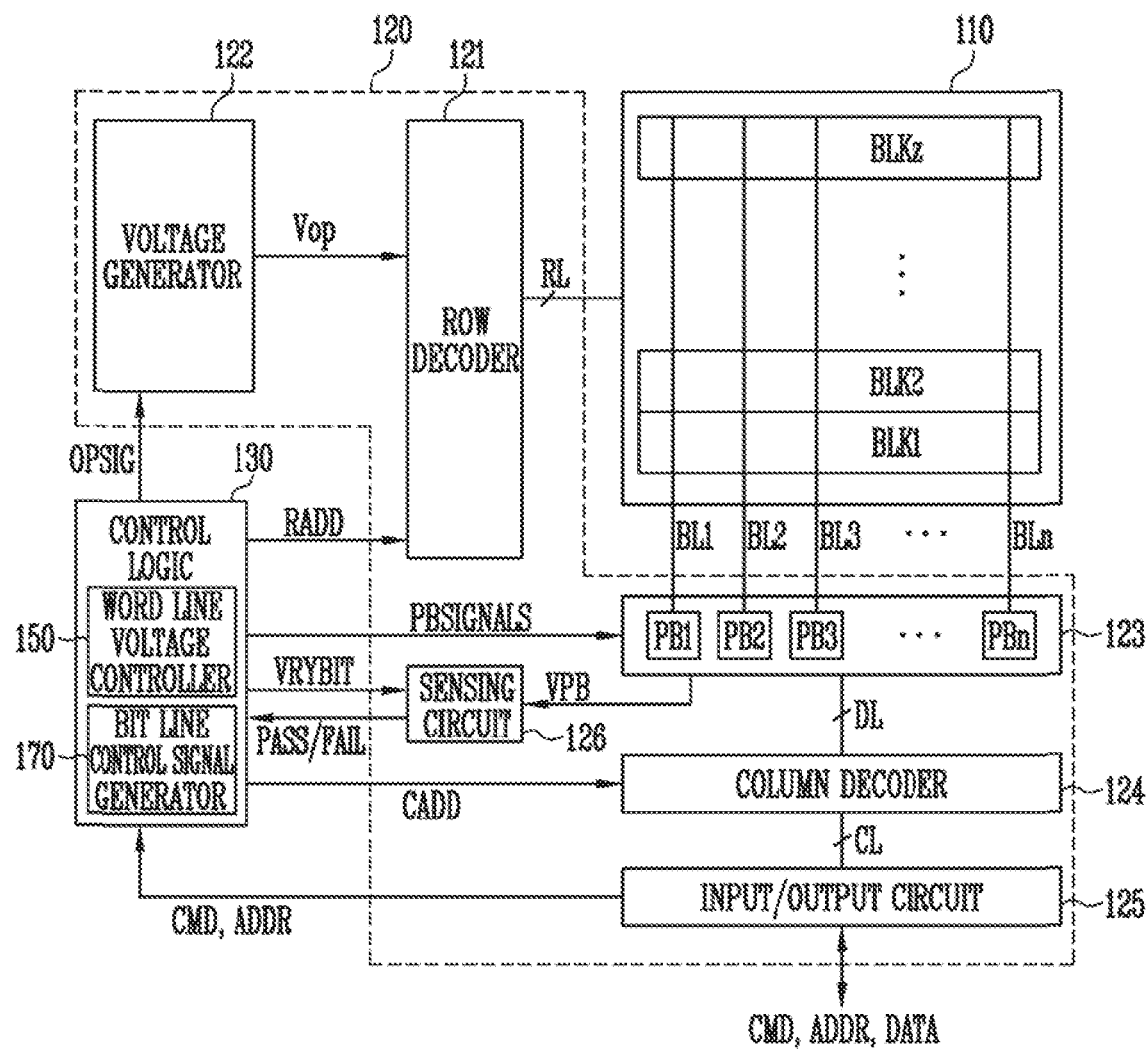
FIG. 2 is a diagram, illustrating a structure of a memory device shown in FIG. 1.

FIG. 2 is a diagram, illustrating a structure of the memory device shown in FIG. 1.

Referring to FIG. 2, the memory device 100 may include a memory cell array 100, a peripheral circuit 120, and a control logic 130.

The memory cell array 110 includes a plurality of memory blocks BLK1 to BLKz. The plurality of memory blocks BLK1 to BLKz are coupled to a row decoder 121 through row lines RL. The plurality of memory blocks BLK1 to BLKz are coupled to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells coupled to the same word line may be defined as one page. Therefore, one memory block may include a plurality of pages.

The row lines RL may include at least one source select line, a plurality of word lines, and at least one drain select line.

In an embodiment, each of the memory cells, included in the memory cell array 110, may be configured as a Single Level Cell (SLC) for storing one data bit, a Multi-Level Cell (MLC) for storing two data bits, a Triple Level Cell (TLC) for storing three data bits, or a Quad Level Cell (QLC) for storing four data bits.

Under the control of the control logic 130, the peripheral circuit 120 may perform a program operation, a read operation, or an erase operation on a selected region of the memory cell array 110. The peripheral circuit 120 may drive the memory cell array 110. For example, under the control of the control logic 130, the peripheral circuit 120 may apply various operating voltages to the row lines RL and the bit lines BL1 to BLn or discharge the applied voltages.

The peripheral circuit 120 may include the row decoder 121, the voltage generator 122, the page buffer group 123, a column decoder 124, and an input/output circuit 125.

The row decoder 121 is coupled to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

Furthermore, the row decoder 121 operates under the control of the control logic 130. The row decoder 121 receives a row address RADD from the control logic 130.

The row decoder 121 decodes the row address RADD, and selects at least one memory block of the memory blocks BLK1 to BLKz based on the decoded address. Additionally, the row decoder 121 may select at least one word line of the selected memory block to apply voltages to. The voltages are generated by the voltage generator 122 and then applied to the at least one word line according the decoded address.

For example, in a program operation, the row decoder 121 may apply a program voltage to the selected word line and may apply a program pass voltage, having a level lower than that of the program voltage, to the unselected word lines. In a program verify operation, the row decoder 121 may apply a verify voltage to the selected word line and may apply a verify pass voltage, having a level higher than that of the verify voltage, to the unselected word lines.

In a read operation, the row decoder 121 may apply a read voltage to the selected word line and may apply a read pass voltage, having a level higher than that of the read voltage, to the unselected word lines.

In an embodiment, an erase operation of the memory device 100 is performed in units of memory blocks. In the erase operation, the row decoder 121 may select one memory block based on the decoded address. In the erase operation, the row decoder 121 may apply a ground voltage to word lines coupled to the selected memory blocks.

The voltage generator 122 operates under the control of the control logic 130. The voltage generator 122 generates a plurality of voltages by using an external power voltage received by the memory device 100. Specifically, the voltage generator may generate various operating voltages Vop used in program, read, and erase operations in response to an operation signal OPSIG. For example, under the control of the control logic 130, the voltage generator 122 may generate a program voltage, a verify voltage, a pass voltage, a read voltage, an erase voltage, and the like.

In an embodiment, the voltage generator 122 may generate an internal power voltage by regulating the external power voltage. The internal power voltage generated by the voltage generator 122 is used as the operation voltage for the memory device 100.

In an embodiment, the voltage generator 122 may generate a plurality of voltages by using the external power voltage or the internal power voltage.

For example, under the control of the control logic 130, the voltage generator 122 may include a plurality of pumping capacitors to receive the internal power voltage, and generate the plurality of voltages by selectively activating the plurality of pumping capacitors.

After the plurality of voltages are generated, the row decoder 121 may supply the plurality of generated voltages to the memory cell array 110.

The page buffer group 123 includes first to nth page buffers PB1 to PBn. The first to nth page buffers PB1 to PBn are coupled to the memory cell array 110, respectively, through first to nth bit lines BL1 to BLn. The first to nth bit lines BL1 to BLn operate under the control of the control logic 130. Specifically, the first to nth bit lines BL1 to BLn may operate in response to page buffer control signals PBSIGNALS. For example, the first to nth page buffers PB1 to PBn may temporarily store data, received through the first to nth bit lines BL1 to BLn, or sense the voltages or the current of the bit lines BL1 to BLn in a read or verify operation.

Specifically, when a program voltage is applied to a selected word line in a program operation, the first to nth page buffers PB1 to PBn may transfer data DATA, received through the input/output circuit 125 to the selected memory cells through the first to nth bit lines BL1 to BLn. Memory cells of a selected page are programmed based on the transferred data DATA. In a program verify operation, the first to nth page buffers PB1 to PBn read page data from the selected memory cells through the first to nth bit lines BL1 to BLn.

In a read operation, the first to nth page buffers PB1 to PBn read data DATA from the memory cells of the selected page through the first to nth bit lines BL1 to BLn, and outputs the read data DATA to the input/output circuit 125 under the control of the column decoder 124.

In an erase operation, the first to nth page buffers PB1 to PBn may float the first to nth bit lines BL1 to BLn.

The column decoder 124 may communicate data between the input/output circuit 125 and the page buffer group 123 in response to a column address CADD. For example the column decoder 124 may communicate data with the first to nth page buffers PB1 to PBn through data lines DL, or communicate data with the input/output circuit 125 through column lines CL.

The input/output circuit 125 may transfer a command CMD and an address ADDR, which are received from the controller 200 described with reference to FIG. 1, to the control logic 130, or communicate data DATA with the column decoder 124.

In a read operation or verify operation, the sensing circuit 125 may generate a reference current in response to an allow bit signal VRYBIT and may output a pass or fail signal PASS/FAIL by comparing a sensing voltage VPB, received from the page buffer group 123, and a reference voltage, generated by the reference current.

In response to the command CMD and the address ADDR, the control logic 130 may control the peripheral circuit 120 by outputting the operation signal OPSIG, the row address RADD, the page buffer control signals PBSIGNALS, and the allow bit signal VRYBIT. Furthermore, the control logic 130 may determine whether the verify operation has passed or failed in response to the pass or fail signal PASS/FAIL.

Each of the memory cells included in the memory cell array 110 may be programmed to any one of the plurality of program states based on the data stored therein. A target program state of a memory cell may be determined as any one of the plurality of program states based on data stored in the memory cell.

In an embodiment of the present disclosure, the control logic 130 may include a word line voltage controller 150.

The word line voltage controller 150 may control the voltage applied to a word line. Specifically, in a program operation of the memory device 100, the word line voltage controller 150 may control a program voltage applied to a selected word line. Therefore, in the program operation, the word line voltage controller 150 may output a voltage code to the voltage generator 122 so that the voltage generator 122 may generate a program voltage.

After the program operation, the word line voltage controller 150 may control a verify voltage so as to perform a verify operation on memory cells coupled to the selected word line. Therefore, in the verify operation, the word line voltage controller 150 may output a voltage code to the voltage generator 122 so that the voltage generator 122 may generate a verify voltage.

In the verify operation, the word line voltage controller 150 may apply a verify voltage to the selected word line and then apply a pass voltage to the selected word line. Furthermore, the word line voltage controller 150 may control a pass voltage applied to unselected word lines, while the pass voltage is being applied to the selected word line. That is, the pass voltage applied to the unselected word lines may be maintained. Therefore, in the verify operation, the word line voltage controller 150 may control the pass voltage such that the pass voltage is applied to the selected word line and the unselected word lines.

In a read operation, the word line voltage controller 150 may control a read voltage for reading data stored in the memory cells coupled to the selected word line. Therefore, in the read operation, the word line voltage controller 150 may output a voltage code for generating a read voltage to the voltage generator 122.

In the read operation, the word line voltage controller 150 may apply the read voltage to the selected word line and then apply the pass voltage to the selected word line. Furthermore, the word line voltage controller 150 may control the pass voltage applied to the unselected word lines, while the pass voltage is being applied to the selected word line. That is, the pass voltage applied to the unselected word lines may be maintained. Therefore, in the read operation, the word line voltage controller 150 may control the pass voltage such that the pass voltage is applied to the selected word line and the unselected word lines.

When the pass voltage is applied to the selected word line and the unselected word lines, an equalizing operation may be performed. The equalizing operation may be an operation for discharging a selected word line, unselected word lines, and bit lines.

In an embodiment of the present disclosure, the control logic 130 may further include a bit line control signal generator 170 configured to control the discharge of bit lines.

In an equalizing operation, the bit line control signal generator 170 may generate bit line control signals for increasing a channel potential. When the bit line control signals are generated, a channel precharge voltage may be applied to the bit line coupled to each of the plurality of page buffers included in the page buffer group. When a bit line precharge voltage is applied to the bit line, a channel may be precharged. While the pass voltage is applied to the selected word line and the unselected word lines, the channel precharge voltage may be applied to the bit line. After the channel precharge voltage is applied to the bit line, the selected word line, the unselected word lines, and the bit lines may be simultaneously discharged.

Figure 3:
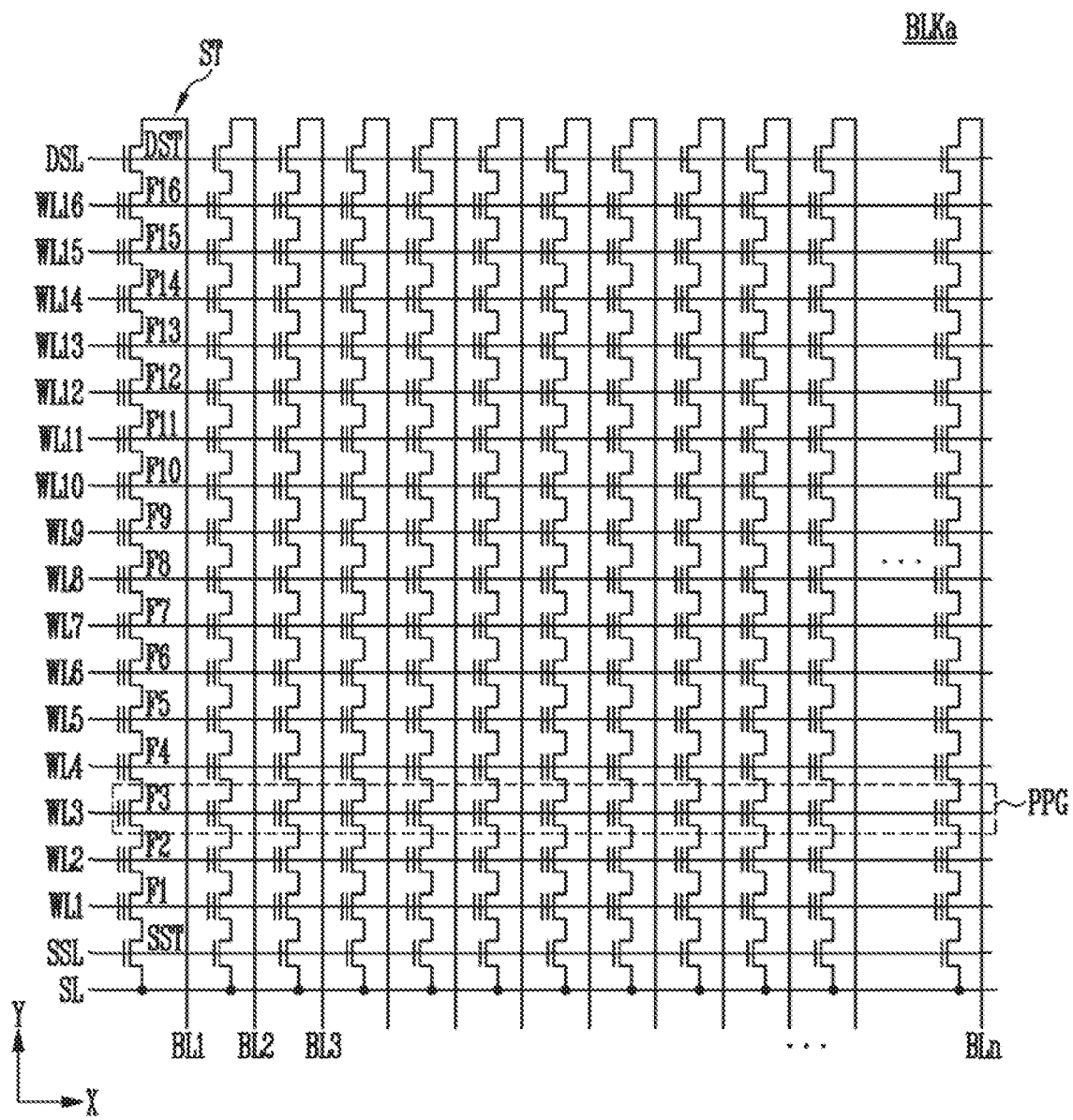
FIG. 3 is a diagram, illustrating a memory block.

FIG. 3 is a diagram illustrating a memory block.

Referring to FIG. 3, FIG. 3 is a circuit diagram, illustrating any one memory block BLKa of the plurality of memory blocks BLK1 to BLKz included in the memory cell array 110 shown in FIG. 2.

In the memory block BLKa, a first select line, word lines, and a second select line may be coupled to each other in parallel. For example, the word lines may be arranged, in parallel, between the first and second select lines. The first select line may be a source select line SSL, and the second select line may be a drain select line DSL.

More specifically, the memory block BLKa may include a plurality of strings coupled between bit lines BL1 to BLn and a source line SL. The bit lines BL1 to BLn may be coupled to the respective strings, and the source line SL may be commonly coupled to the strings. The strings may be configured identically to one another, and therefore, a string ST coupled to a first bit line BL1 will be described in detail as an example.

The string ST may include a source select transistor SST, a plurality of memory cells F1 to F16, and a drain select transistor DST, which are coupled, in series, to each other between the source line SL and the first bit line BL1. At least one source select transistor SST and at least one drain select transistor DST may be included in one string ST. In an embodiment, one string ST may include more memory cells than that of the memory cells F1 to F16 shown in the drawing.

A source of the source select transistor SST may be coupled to the source line SL, and a drain of the drain select transistor DAT may be coupled to the first bit line BL1. The memory cells F1 to F16 may be coupled, in, series between the source select transistor SST and the drain select transistor DST. Gates of source select transistors SST, included in different strings, may be coupled to the source select line SSL, and gates of drain select transistors DST, included in different strings, may be coupled to the drain select line DSL. Gates of the memory cells F1 to F16 may be coupled to a plurality of word lines WL1 to WL16. A group of memory cells, coupled to the same word line of memory cells included in different strings, may be referred to as a physical page PPG. Therefore, physical pages, corresponding to the number of the word lines WL1 to WL16, may be included in the memory block BLKa.

One memory cell may store data of one bit. The memory cell is generally referred to as a single level cell (SLC). One physical page PG may store one logical page (LPG) data. The number of data bits in one LPG data may be less than or equal to the number of cells included in one physical page PPG. In another embodiment, one memory cell MC may store data of two or more bits. Such a memory cell is generally referred to as a multi-level cell (MLC). One physical page PPG may store two or more LPG data.

A memory cell for storing data of two or more bits is referred to as the MLC. However, as the number of bits of data capable of being stored in one memory cell increases, the term "MLC" now refers to memory cells for storing data of only two bits. A memory cell for storing data of three or more bits is referred to as a triple level cell (TLC), and a memory cell for storing data of four or more bits is referred to as a quadruple level cell (QLC). As memory cells for storing data of a plurality of bits have been developed, these embodiments may be applied to memory systems in which data of two or more bits can be stored.

In another embodiment, each of the plurality of memory blocks may have a three-dimensional structure. Each memory block may include a plurality of memory cells stacked on a substrate. The plurality of memory cells may be arranged along +X, +Y, and +Z directions.

Figure 4:
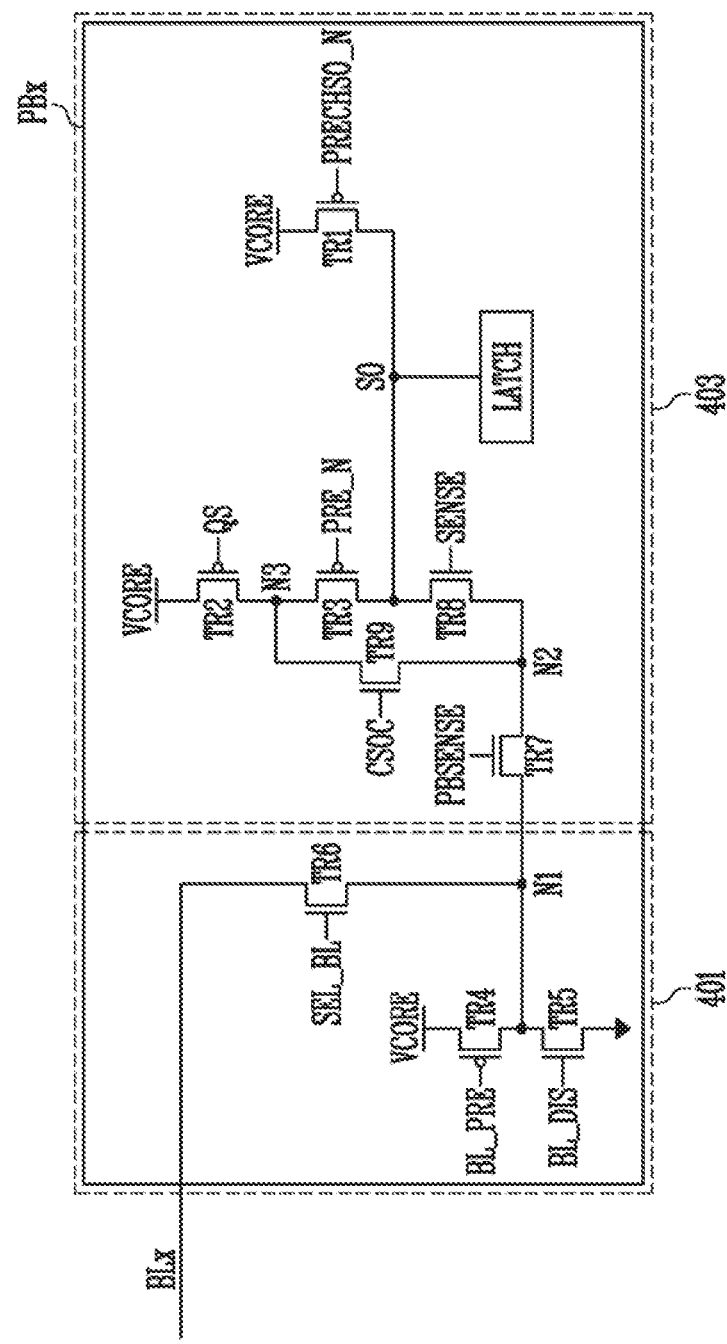
FIG. 4 is a diagram, illustrating a configuration of each page buffer, included in a page buffer group of the memory device, shown in FIG. 1.

FIG. 4 is a diagram, illustrating a configuration of each page buffer included in the page buffer group of the memory device shown in FIG. 1.

Referring to FIG. 2, FIG. 4 illustrates any one of the plurality of page buffers PB1 to PBn, included in the page buffer group 123, and a bit line BLx, coupled to the page buffer PBx.

The page buffer group 123 may include a plurality of page buffers PB1 to PBn. Each of the plurality of page buffers PB1 to PBn, included in the page buffer group 123, may include a bit line transistor component 401 and a sensing transistor component 403. The bit line transistor component 401 may include fourth to sixth transistors TR4 to TR6, and the sensing transistor component 403 may include first to third and seventh to ninth transistors TR1 to TR3 and TR7 to TR9 and a latch. That is, each page buffer may include first to ninth transistors TR1 to TR9 and a latch. The latch may be configured with transistors to store data sensed through the bit line BLx. The first to ninth transistors TR1 to TR9 may be turned on or turned off to control a voltage applied to the bit line BLx.

The first transistor TR1 may be a sensing node precharge transistor coupled between a power source VCORE and a sensing node SO. The first transistor TR1 may be turned on or turned off by a sensing node precharge signal PRECHSO_N. When the first transistor TR1 is turned on by the sensing node precharge signal PRECHSO_N, the power source VCORE and the sensing node SO may be coupled to each other. That is, a current path between the power source VCORE and the sensing node SO may be formed by the sensing node precharge signal PRECHSO_N. In an embodiment, the first transistor TR1 may be implemented with a PMOS transistor.

The second transistor TR2 may be a data transmission transistor coupled between the power source VCORE and a third node N3. The second transistor TR2 may be turned on or turned off by a data transmission signal QS. When the second transistor TR2 is turned on by the data transmission signal QS, the power source VCORE and the third node N3 may be coupled to each other. That is, a current path between the power source VCORE and the third node N3 may be formed by the data transmission signal QS. In an embodiment, the second transistor T2 may be implemented with a PMOS transistor.

The third transistor TR3 may be a precharge transistor coupled between the third node N3 and the sensing node SO. The third transistor TR3 may be turned on or turned off by a precharge signal PRE_N. When the third transistor TR3 is turned on by the precharge signal PRE_N, the third node N3 and the sensing node SO may be coupled to each other. That is, a current path between the third node N3 and the sensing node SO may be formed by the precharge signal PRE_N. In an embodiment, the third transistor TR3 may be implemented with a PMOS transistor.

The fourth transistor TR4 may be a bit line precharge transistor coupled between the power source VCORE and a first node N1. The fourth transistor TR4 may be turned on or turned off by a bit line precharge signal BL_PRE. When the fourth transistor TR4 is turned on by the bit line precharge signal BL_PRE, the power source VCORE and the first node N1 may be coupled to each other. That is, a current path between the power source VCORE and the first node N1 may be formed by the bit line precharge signal BL_PRE. In an embodiment, the fourth transistor TR may be implemented with a PMOS transistor.

The fifth transistor TR5 may be a bit line discharge transistor coupled between the first node N1 and a ground. The fifth transistor TR5 may be turned on or turned off by a bit line discharge signal BL_DIS. When the fifth transistor TR5 is turned on by the bit line discharge signal BL_DIS, the first node N1 and the ground may be coupled to each other. That is, a current path between the first node N1 and the ground may be formed by the bit line discharge signal BL_DIS. In an embodiment, the fifth transistor TR5 may be implemented with an NMOS transistor.

The sixth transistor TR6 may be a bit line select transistor coupled between a first node and a bit line, the bit line coupled to each of the page buffers. The sixth transistor TR6 may be turned on or turned off by a bit line select signal SEL_BL. When the sixth transistor TR6 is turned on by the bit line select signal SEL_BL, the bit line and the first node N1 may be coupled to each other. That is, a current path between the bit line and the first node N1 may be formed by the bit line select signal SEL_BL. In an embodiment, the sixth transistor TR6 may be implemented with an NMOS transistor.

The seventh transistor TR7 may be a sensing transistor coupled between the first node N1 and a second node N2. The seventh transistor TR7 may be turned on or turned off by a sensing signal PESENSE. When the seventh transistor TR7 is turned on by the sensing signal PESENSE, the first node N1 and the second node N2 may be coupled to each other. That is, a current path between the first node N1 and the second node N2 may be formed by the sensing signal PESENSE. In an embodiment, the seventh transistor TR7 may be implemented with an NMOS transistor.

The eighth transistor TR8 may be a sensing transmission transistor coupled between the sensing node SO and the second node N2. The eighth transistor TR8 may be turned on or turned off by a sensing transmission signal SENSE. When the eighth transistor TR8 is turned on by the sensing transmission signal SENSE, the sensing node SO and the second node N2 may be coupled to each other. That is, a current path between the sensing node SO and the second node N2 may be formed by the sensing transmission signal SENSE. In an embodiment, the eighth transistor TR8 may be implemented with an NMOS transistor.

The ninth transistor TR9 may be a precharge transmission transistor coupled between the second node N2 and the third node N3. The ninth transistor TR9 may be turned on or turned off by a precharge transmission signal CSOC. When the ninth transistor TR9 is turned on by the precharge transmission signal CSOC, the second node N2 and the third node N3 may be coupled to each other. That is, a current path between the second node N2 and the third node N3 may be formed by the precharge transmission signal CSOC. In an embodiment, the ninth transistor TR9 may be implemented with a PMOS transistor.

In an embodiment, in a sensing operation, the sensing node SO and the latch may be coupled to each other. In the sensing operation, data sensed through the bit line may be stored in the latch. In the sensing operation, the control logic may control the peripheral circuit to turn on or turn off the data transmission transistor (i.e., the second transistor TR2), the precharge transmission transistor (i.e., the ninth transistor TR9), and the precharge transistor (i.e., the third transistor TR3) so that the sensing node SO and the latch are coupled to each other. Alternatively, in the sensing operation, the control logic may control the peripheral circuit to turn on or turn off the sensing transmission transistor (i.e., the eighth transistor TR8) such that the sensing node SO and the latch are coupled to each other.

In the sensing operation, signals for turning on or turning off transistors included in each page buffer will be described in more detail with reference to FIG. 5.

Figure 5:
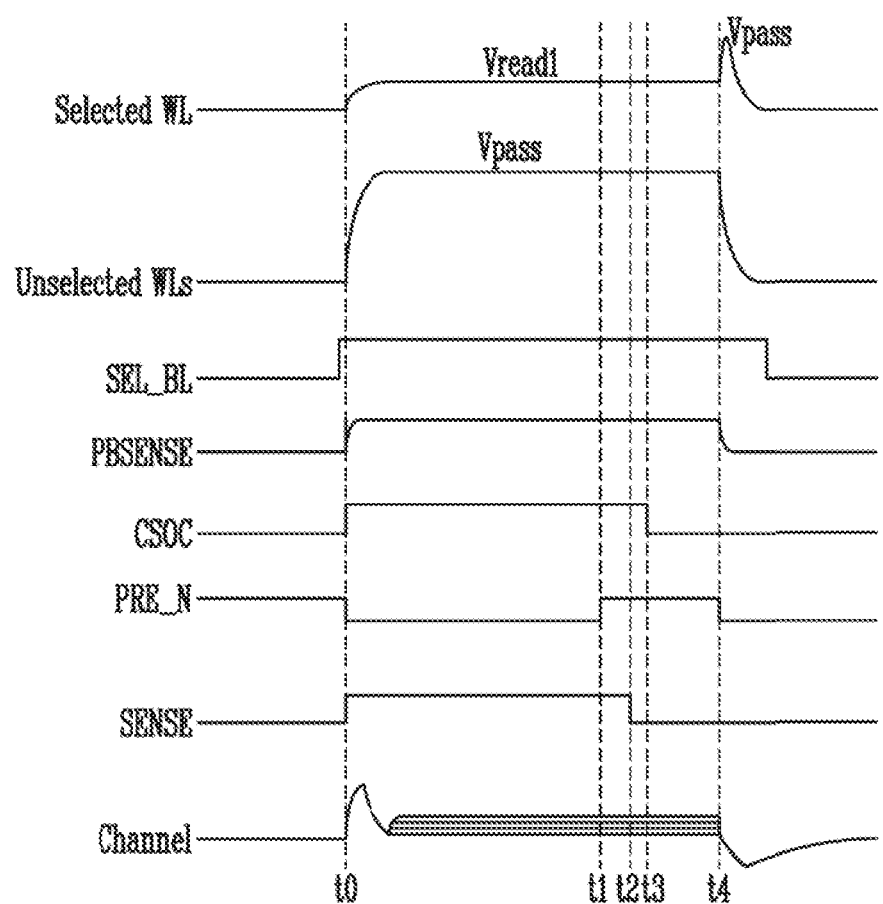
FIG. 5 is a diagram, illustrating signals, applied to a plurality of word lines and a plurality of transistors, included in each of a plurality of page buffers, and channel negative boosting, occurring in an equalizing operation.

FIG. 5 is a diagram, illustrating signals applied to a plurality of word lines and a plurality of transistors included in each of a plurality of page buffers, and channel negative boosting occurring in an equalizing operation.

Referring to FIG. 5, FIG. 5 illustrates, in a sensing operation on a selected word line Selected WL of a plurality of word lines coupled to a memory block, voltages applied to the selected word line Selected WL and unselected word lines Unselected WLs, signals applied to a plurality of transistors included in each of the plurality of page buffers, and a change in channel potential. In FIG. 5, a case where a sensing operation is performed after t0 is assumed.

Referring back to FIGS. 2 and 4, the bit line select signal SEL_BL may be a signal for turning on or turning off the bit line select transistor (i.e., the sixth transistor TR6). The sensing signal PBSENSE may be a signal for turning on or turning off the sensing transistor (i.e., the seventh transistor TR7). The precharge transmission signal CSOC may be a signal for turning on or turning off the precharge transmission transistor (i.e., the ninth transistor TR9). The precharge signal PRE_N may be a signal for turning on or turning off the precharge transistor (i.e., the third transistor TR3). The sensing transmission signal SENSE may be a signal for turning on or turning off the sensing transmission transistor (i.e., the eighth transistor TR8).

In an embodiment, the bit line select signal SEL_BL, the sensing signal PBSENSE, the precharge transmission signal CSOC, the precharge signal PRE_N, and the sensing transmission signal SENSE may be bit line control signals for applying a voltage to bit lines. The bit line control signals may be output from the bit line control signal generator. The bit line control signal generator may be included in the memory device. In an embodiment, the bit line control signal generator may be included in the control logic of the memory device.

The bit line control signal generator may generate bit line control signals for apply a channel precharge voltage to bit lines coupled to the respective plurality of page buffers. The bit line control signals may be signals for turning on or turning off at least one of the plurality of transistors included in each of the plurality of page buffers.

In an embodiment, before time to, the bit line select signal SEL_BL, the sensing signal PBSENSE, the precharge transmission signal CSOC, and the sensing transmission signal SENSE may be outputted in a low state. The bit line select transistor TR6, the sensing transistor TR7, the precharge transmission transistor TR9, and the sensing transmission transistor TR8 may be turned off by the bit line select signal SEL_BL, the sensing signal PBSENSE, the precharge transmission signal CSOC, and the sensing transmission signal SENSE, which are in the low state. That is, before the sensing operation, the bit line select transistor TR6, the sensing transistor TR7, the precharge transmission transistor TR9, and the sensing transmission transistor TR8 may be in an inactive state by the bit line select signal SEL_BL, the sensing signal PBSENSE, the precharge transmission signal CSOC, and the sensing transmission signal SENSE, which are in the low state.

Before time t0, the precharge signal PRE_N may be outputted in a high state. The precharge transistor TR3 may be turned off by the precharge signal PRE_N in the high state. That is, before the sensing operation, the precharge transistor TR3 may be in the inactive state due to the precharge signal PRE_N being in the high state.

The bit line select signal SEL_BL may be outputted in the high state before time t0, to be outputted in the low state after a first read (verify) operation, a second read (verify) operation, and a word line discharge are completed. Therefore, in response to the bit line select signal SEL_BL, the bit line select transistor TR6 may maintain a turn-on state from a time at which the sensing operation is started to a time at which the discharge of the plurality of word lines is completed.

Consequently, the bit line select transistor TR6 may be turned on before the sensing operation is performed, and data may be sensed through the bit line. Subsequently, the bit line select transistor TR6 may be turn off after the word line discharges, so that the bit line and the page buffer can be separated from each other.

After time t0, the sensing operation may be performed. The sensing operation may be an operation of sensing the selected word line Selected WL of the plurality of word lines coupled to the memory block. The sensing operation may be a read operation or verify operation. The control logic may control the peripheral circuit to perform the sensing operation by applying a sensing voltage to the selected word line Selected WL and applying a pass voltage Vpass to the unselected word lines Unselected WLs. Furthermore, the control logic may control the peripheral circuit to apply a channel precharge voltage to bit lines coupled to selected memory cells, respectively.

The operation of applying the channel precharge voltage to the bit lines will be described in more detail with reference to FIGS. 8 to 10.

At time t0, the voltage applied to the selected word line Selected WL may be a first read voltage Vread1. The first read voltage Vread1 may be a voltage to distinguish an erase state from a program state of selected memory cells, coupled to the selected word line Selected WL. In another embodiment, the voltage applied to the selected word line Selected WL may be a first verify voltage. The first verify voltage may be a voltage for determining whether the selected memory cells, coupled to the selected word line Selected WL, have been programmed to a target program state. The first read voltage Vread1 or the first verify voltage may be the sensing voltage.

At time to, the voltage applied to the unselected word lines Unselected WLs may be the pass voltage Vpass. The pass voltage Vpass may be a voltage for turning off memory cells coupled to word lines except the selected word line Selected WL. The pass voltage Vpass may be applied to the unselected word lines Unselected WLs and may be maintained until the sensing operation is completed. That is, the pass voltage Vpass may be applied to the unselected word lines Unselected WLs until first and second read operations or first and second verify operations are completed.

At time t0, the sensing signal PBSENSE, the precharge transmission signal CSOC, and the sensing transmission signal SENSE may be changed from the low state to the high state and then output. The bit line select transistor TR6, the sensing transistor TR7, the precharge transmission transistor TR9, and the sensing transmission transistor TR8 may be turned on by the bit line select signal SEL_BL, the sensing signal PBSENSE, the precharge transmission signal CSOC, and the sensing transmission signal SENSE, which are in the high state.

At time t0, the precharge signal PRE_N may be changed from the high state to the low state and then outputted. The precharge transistor TR3 may be turned on by the precharge signal PRE_N in the low state.

At time t0, when the sensing transistor TR7, the precharge transmission transistor TR9, the sensing transmission transistor TR8, and the precharge transistor TR3 are turned on, the sensing operation may be started. The started sensing operation may be the first read operation or the first verify operation.

At time t0, when the sensing signal PBSENSE, in the high state, is output, the sensing signal PBSENSE may be outputted in the high state until the sensing operation is completed. That is, while the memory device is performing the first read (verify) operation and the second read (verify) operation, the sensing signal PBSENSE may be outputted in the high state. Therefore, while the memory device is performing the sensing operation, the sensing transistor TR7 may be turned on by the sensing signal PBSENSE.

At time t0, when a first sensing voltage is applied to the selected word line Selected WL, and the pass voltage Vpass is applied to the unselected word lines Unselected WLs, the sensing operation may be started. In an embodiment, the first sensing voltage may be the first read voltage Vread1 or the first verify voltage. After the sensing operation begins, programmed data stored in the memory cells, coupled to the selected word line, may be sensed through bit lines coupled to the respective memory cells.

In order to store the data sensed through the bit lines in the latch coupled to the sensing node, the precharge signal PRE_N changed from the low state to the high state may be outputted at time t1, the sensing transmission signal SENSE changed from the high state to the low state may be outputted at time t2, and the precharge transmission signal CSOC changed from the high state to the low state may be outputted at t3.

Therefore, at time t1 to time t3, the precharge transistor TR3, the sensing transmission transistor TR8, and the precharge transmission transistor TR9 may be sequentially turned off. In order to store the data sensed through the bit lines in the latch, coupled to the sensing node, at time t1 to time t3, the precharge transistor TR3, the sensing transmission transistor TR8, and the precharge transmission transistor TR9 may be sequentially turned off.

At time t3 to time t4, the data sensed through the bit lines may be stored in the latch. The sensed data may be read data or verify data. The read data may be data read through the bit lines so as to read the data programmed in the memory cells. The verify data may be data read through the bit lines so as to verify the data programmed in the memory cells. A program state of the memory cells may be determined based on the sensed data.

After time t4, the sensing operation may be re-performed. However, the figures disclose one embodiment in which the sensing operation is performed only once. In another embodiment, the sensing operation may be performed twice or more.

After time t4, the sensing operation may be terminated. Therefore, an equalizing operation may be performed after the sensing operation. The equalizing operation may be an operation for discharging a plurality of word lines, coupled to a memory block. The plurality of word lines, coupled to the memory block, may include a selected word line Selected WL and unselected word lines Unselected WLs.

In the equalizing operation, the pass voltage Vpass may be applied to the selected word line Selected WL after the first read operation or the first verify operation so as to simultaneously discharge the plurality of word lines. After the pass voltage Vpass is applied to the selected word line Selected WL, the selected word line Selected WL and the unselected word lines Unselected WLs may be simultaneously discharged. Normally, when the plurality of word lines is discharged, different voltages are applied to the selected word line Selected WL and the unselected word lines Unselected WLs, and hence, the time at which the discharge operation on the selected word line Selected WL is completed may be different from the time at which the discharge operation on the unselected word lines Unselected WLs is completed. Therefore, the pass voltage Vpass may be applied to the selected word line Selected WL such that the discharge of the plurality of word lines can be completed at the same time.

In an embodiment, the potential of a channel Channel may be a channel potential of a plurality of memory cells coupled to any one cell string of a plurality of cell strings coupled to the bit lines. The channel potential before the sensing operation is performed may be 0V.

At time t0, the channel potential may instantaneously increase and then decrease back to 0V. Specifically, when the sensing operation is started, the sensing voltage may be applied to the selected word line Selected WL, and the pass voltage Vpass may be applied to the unselected word lines Unselected WLs. When the sensing voltage and the pass voltage Vpass are applied to the respective selected word line Selected WL and the respective unselected word lines Unselected WLs, channel coupling between the word lines may occur. When the channel coupling between the word lines occurs, the channel potential may be increased. The increased channel potential may again become 0V after a certain time elapses.

The channel potential again changed to 0V may have various potentials based on program states of the memory cells. That is, since the plurality of memory cells, coupled to the cell string, may have various program states, a current flowing in the plurality of memory cells may vary depending on a voltage applied to a word line. Consequently, the channel potential may have various values based on program states of the plurality of memory cells coupled to the cell string.

The channel potential may again become 0V after the sensing operation is ended (i.e., after time t4). That is, when the plurality of word lines is discharged, the bit lines may also be discharged, so that the channel potential again becomes 0V.

In an embodiment, since the plurality of memory cells coupled to the cell string have various program states, the plurality of memory cells may have various cut-off times when the bit lines discharged. Since the plurality of memory cells may have various cut-off times, capacitance coupling between the word lines may occur. When the capacitance coupling occurs, the channel potential may have a negative value. Consequently, since the plurality of memory cells may have various cut-off times, channel negative boosting may occur.

After the channel negative boosting, a Hot Carrier Injection (HCI) disturb may occur in the memory block adjacent to the memory block on which the sensing operation is performed. The HCI disturb may occur as a positive voltage and may be applied to the drain select line DSL and the source select line SSL when an erase operation on the adjacent memory block is performed after the channel negative boosting. That is, hot carriers may be generated based on a voltage applied when the erase operation on the adjacent memory block is performed after the channel negative boosting, and a disturb phenomenon may occur due to the hot carriers. The disturb phenomenon may be a disturb phenomenon occurring in the erase operation.

When the channel negative boosting occurs, the channel potential may have a negative value. The channel potential may become a negative potential due to the channel negative boosting and then again become 0V.

The cut-off times of the plurality of memory cells will be described in more detail with reference to FIGS. 6 and 7.

Figure 6:
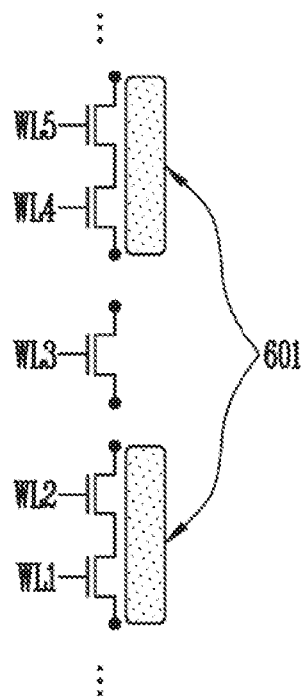
FIG. 6 is a diagram, illustrating a process in which channel negative boosting occurs in cut-off of a memory cell.

FIG. 6 is a diagram, illustrating a process in which channel negative boosting occurs in cut-off of a memory cell.

Referring to FIG. 6, FIG. 6 illustrates some of memory cells of a cell string coupled to any one bit line of a plurality of bit lines. A plurality of memory cells may be coupled to the cell string. In another embodiment, memory cells of which number is greater than that of the memory cells shown in FIG. 6 may be coupled to the cell string. The memory cells coupled to the cell string may be respectively coupled to word lines, respectively.

FIG. 6 illustrates memory cells coupled to first to fifth word lines WL1 to WL5 of the memory cells coupled to the cell string.

In an embodiment, the memory cells, coupled to the first to fifth word lines WL1 to WL5, may be in an erase state or program state. The memory cells coupled to the first to fifth word lines WL1 to WL5 may be programmed in various program states. That is, when the memory cells, coupled to the first to fifth word lines WL1 to WL5, are Single Level Cells (SLCs), the memory cells may be in the erase state or program state. When the memory cells coupled to the first to fifth word lines WL1 to WL5 are Multi-Level Cells (MLCs), the memory cells may be in the erase state and any one state of first to third program states. When the memory cells, coupled to the first to fifth word lines WL1 to WL5, are Triple Level Cells (TLCs), the memory cells may be in the erase state and any one state of first to seventh program states. When the memory cells, coupled to the first to fifth word lines WL1 to WL5, are Quad Level Cells (QLCs), the memory cells may be in the erase state and any one state of first to fifteenth program states.

Since the memory cells, coupled to the cell string, may have various program states, the memory cells may have various cut-off times in an equalizing operation after a sensing operation. The sensing operation may be a read operation or verify operation. The equalizing operation may be an operation of equalizing a voltage, applied to a selected word line Selected WL, and a voltage, applied to unselected word lines Unselected WL, so as to equalize times at which a plurality of word lines is discharged.

In FIG. 6, the program state of the memory cell, coupled to the third word line WL3, may be a highest program state. Therefore, in the equalizing operation, the memory cell coupled to the third word line WL3 may be cut off first of all.

When the memory cell, coupled to the third word line WL3, is cut off, channel negative boosting may occur in a channel 601 of the memory cells, coupled to the first and second word lines WL1 and WL2, and a channel 601 of the memory cells, coupled to the fourth and fifth word lines WL4 and WL5. That is, in a word line discharge, when the memory cell, coupled to the third word line WL3, is cut off, a large number of charges may exist in the channel 601 of the memory cells that are not cut off, as compared with the channel 601 of the memory cells that are cut off. When a large number of charges exist in the channel of the memory cells that are not cut off, the channel potential may have a negative value and then again become 0V.

Figure 7:
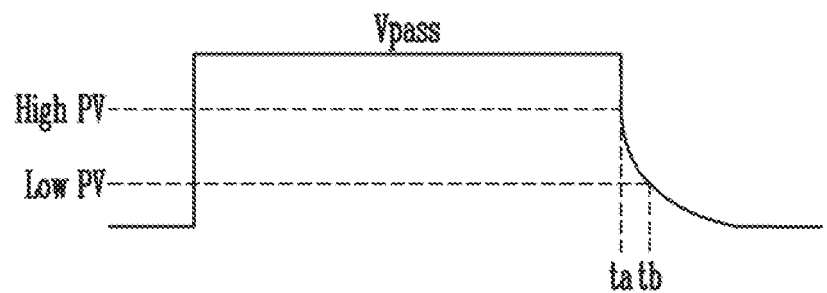
FIG. 7 is a diagram, illustrating cut-off times of memory cells.

FIG. 7 is a diagram, illustrating cut-off times of memory cells.

Referring to FIG. 7, FIG. 7 illustrates a change in voltage applied to unselected word lines Unselected WLs of a plurality of word lines coupled to a memory block.

In an embodiment, in a sensing operation on selected memory cells, coupled to a selected word line WL, the voltage applied to the unselected word lines Unselected WLs may be a pass voltage Vpass. The voltage applied to the unselected word lines Unselected WLs may be maintained as the pass voltage Vpass while the sensing operation is being performed. That is, while the pass voltage Vpass is being applied to the selected word line Selected WL, the control logic may control the peripheral circuit to maintain the pass voltage Vpass applied to the unselected word lines Unselected WLs.

After the sensing operation, the unselected word lines Unselected WLs may be precharged. Therefore, the voltage, applied to the unselected word lines Unselected WLs, may become 0V after the sensing operation.

In an embodiment, memory cells, coupled to the unselected word lines Unselected WLs, may have various program states. Since the memory cells, coupled to the unselected word lines Unselected WLs, have various program states, the memory cells, coupled to the unselected word lines Unselected WLs, may have various cut-off times in a discharge after the sensing operation.

FIG. 7 illustrates times at which the memory cells are cut off based on program states of the memory cells, coupled to the unselected word lines Unselected WLs.

In an embodiment, the voltage applied to the unselected word lines Unselected WLs may be changed from 0V to the pass voltage Vpass and then changed from the pass voltage Vpass to 0V.

In an embodiment, the program state of the memory cells, coupled to the unselected word lines Unselected WLs, may be a high program state High PV or low program state Low PV. Since the voltage applied to the unselected word lines Unselected WLs is decreased from the pass voltage Vpass to 0V, the memory cells may be first cut off from memory cells in the high program state High PV. That is, the memory cells in the high program state High PV may be first separated from memory cells coupled to the same cell string.

In FIG. 7, the memory cells in the high program state High PV may be cut off at a time ta. That is, since the voltage applied to the unselected word lines Unselected WLs is decreased from the pass voltage Vpass, the memory cells in the high program state High PV may be first cut off.

In an embodiment, memory cells in the low program state Low PV may be cut off at a time tb. That is, after the memory cells in the high program state High PV are cut off, the memory cells in the low program state Low PV may be cut off. Since the voltage applied to the unselected word lines Unselected WLs is decreased from the pass voltage Vpass, the memory cells in the low program state Low PV may be cut off after the memory cells in the high program state High PV are cut off.

Consequently, memory cells, coupled to one cells string, have various program states, and various cut-off times of the memory cells exist based on various program states. Hence, channel negative boosting may occur.

Figure 8:
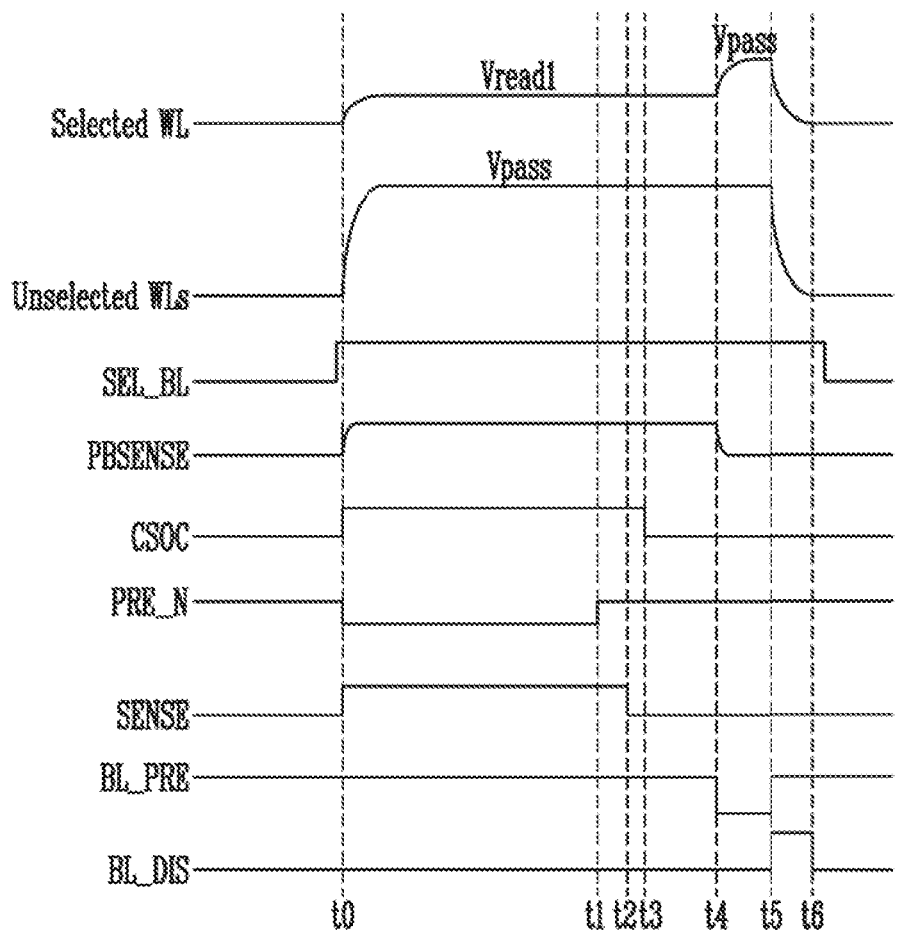
FIG. 8 is a diagram, illustrating a method for applying a channel precharge voltage to bit lines in accordance with an embodiment of the present disclosure.

FIG. 8 is a diagram illustrating a method for applying a channel precharge voltage to bit lines in accordance with an embodiment of the present disclosure.

Referring to FIGS. 4, 5, and 8, FIG. 8 illustrates a method for applying a channel precharge voltage to bit lines so as to prevent channel negative boosting. Like FIG. 5, FIG. 8 illustrates, in a sensing operation on a selected word line Selected WL of a plurality of word lines, coupled to a memory block, voltages applied to the selected word line Selected WL and unselected word lines Unselected WLs and signals applied to a plurality of transistors included in each of the plurality of page buffers. FIG. 8 further illustrates a bit line precharge signal BL_PRE and a bit line discharge signal BL_DIS, in addition to the signals shown in FIG. 5.

In FIG. 8, a case where a sensing operation is performed after t0 is assumed.

Referring to FIGS. 2, 4, 5, and 8, the bit line select signal SEL_BL may be a signal for turning on or turning off the bit line select transistor (i.e., the sixth transistor TR6). The sensing signal PBSENSE may be a signal for turning on or turning off the sensing transistor (i.e., the seventh transistor TR7). The precharge transmission signal CSOC may be a signal for turning on or turning off the precharge transmission transistor (i.e., the ninth transistor TR9). The precharge signal PRE_N may be a signal for turning on or turning off the precharge transistor (i.e., the third transistor TR3). The sensing transmission signal SENSE may be a signal for turning on or turning off the sensing transmission transistor (i.e., the eighth transistor TR8). The bit line precharge signal BL_PRE may be a signal for turning on or turning off the bit line precharge transistor (i.e., the fourth transistor TR4). The bit line discharge signal BL_DIS may be a signal for turning on or turning off the bit line discharge transistor (i.e., the fifth transistor TR5).

In an embodiment, the bit line select signal SEL_BL, the sensing signal PBSENSE, the precharge transmission signal CSOC, the precharge signal PRE_N, the sensing transmission signal SENSE, the bit line precharge signal BL_PRE, and the bit line discharge signal BL_DIS may be bit line control signals for applying a voltage to bit lines. The bit line control signals may be outputted from the bit line control signal generator. The bit line control signal generator may be included in the memory device. In an embodiment, the bit line control signal generator may be included in the control logic of the memory device.

The bit line control signal generator may generate bit line control signals for apply a channel precharge voltage to bit lines, coupled to the respective plurality of page buffers. The bit line control signals may be signals for turning on or turning off at least one of the plurality of transistors included in each of the plurality of page buffers.

Referring to FIGS. 5 and 8, at t0 to t6, the bit line select signal SEL_BL, the sensing signal PBSENSE, the precharge transmission signal CSOC, the precharge signal PRE_N, and the sensing transmission signal SENSE, which are outputted from the bit line control signal generator, are identical to those shown in FIG. 5, and therefore, their overlapping descriptions will be omitted.

In an embodiment, after the sensing operation on the selected memory cells, coupled to the selected word line Selected WL, i.e., after t4, an operation for applying a channel precharge voltage to the bit lines may be performed.

Unlike FIG. 5, in FIG. 8, the channel precharge voltage may be applied to the bit lines. After the sensing operation, the control logic may control the peripheral circuit to apply the pass voltage Vpass to the selected word line Selected WL and to apply the channel precharge voltage to the bit lines while the pass voltage Vpass is being applied to the selected word line Selected WL.

In an embodiment, the channel precharge voltage may be applied to the bit lines so as to prevent channel negative boosting. When the channel precharge voltage is applied to the bit lines, channel charges are moved toward the bit lines, so that the channel negative boosting can be prevented.

In an embodiment, the bit line select signal SEL_BL may be outputted in the high state before t0, to be outputted in the low state after the first read (verify) operation and the discharge of the bit lines and the word lines are completed. Therefore, the bit line select transistor TR6 may maintain the turn-on state from a time at which the sensing operation is started to a time at which the bit lines and the word lines are discharged, in response to the bit line select signal SEL_BL.

At t4 and t5, the bit line precharge signal BL_PRE in the low state may be generated so as to apply the channel precharge voltage to the bit lines. That is, in order to apply the channel precharge voltage to the bit lines, the bit line control signal generator may generate the bit line precharge signal BL_PRE in the low state. The bit line precharge transistor TR4 may be turned on by the bit line precharge signal BL_PRE in the low state. When the bit line precharge transistor TR4 is turned on, a power voltage may be applied to the bit lines. The power voltage may be the channel precharge voltage.

That is, when the bit line precharge transistor TR4 is turned on, the power source and the first node may be coupled to each other. Therefore, a current path may be formed between the power source and the first node, and the channel precharge voltage (power voltage) may be applied to the bit lines through the bit line select transistor TR6.

When the power voltage is applied to the bit lines, a channel may be precharged.

In an embodiment, the bit line control signal generator may generate the bit line precharge signal BL_PRE in the low state, which is used to turn on the bit line precharge transistor TR4, while the pass voltage Vpass is being applied to the selected word line Selected WL. The bit line precharge signal BL_PRE in the low state may be applied to a gate of the bit line precharge transistor TR4. The bit line precharge transistor TR4 may be a PMOS transistor.

Conventionally, in the equalizing operation after the sensing operation, the selected word line Selected WL and the unselected word lines Unselected WLs were discharged, just after the pass voltage Vpass was applied to the selected word line Selected WL.

However, in the present disclosure, at t4 and t5, the pass voltage Vpass may be applied to the selected word line Selected WL for a certain time so as to apply the channel precharge voltage to the bit lines. While the pass voltage Vpass is being applied to the selected word line Selected WL, the voltage applied to the unselected word lines Unselected WLs may also be maintained as the pass voltage Vpass.

In an embodiment, before or after the pass voltage Vpass is applied to the selected word line Selected WL, the bit line control signal generator may generate the bit line precharge signal BL_PRE in the high state. That is, the bit line precharge transistor TR4 may be turned off, before or after the operation of applying the channel precharge voltage to the bit lines is performed.

In an embodiment, after the channel precharge voltage is applied to the bit lines, at t5 and t6, the bit line control signal generator may generate the bit line discharge signal BL_DIS in the high state. The bit line discharge signal BL_DIS in the high state may be a signal for turning on the bit line discharge transistor TR5. The bit line discharge signal BL_DIS in the high state may be applied to a gate of the bit line discharge transistor TR5. When the bit line discharge signal BL_DIS in the high state is applied to the gate of the bit line discharge transistor TR5, the voltage applied to the bit line may become 0V. When the voltage applied to the bit line becomes 0V, the bit lines may be discharged. That is, the bit lines may be simultaneously discharged when the word lines are discharged.

Consequently, the channel precharge voltage is applied to the bit lines through the bit line precharge signal BL_PRE, so that the channel negative boosting can be prevented. That is, in the discharge operation of the word lines after the sensing operation, the channel precharge voltage is applied to the bit lines, so that the channel potential can become a positive value. When the channel potential becomes the positive value, the channel negative boosting can be prevented.

After t6, since all the operations performed through the bit lines have been ended, the bit line control signal generator may generate the bit line select signal SEL_BL in the low state so as to turn off the bit line select transistor TR6.

Figure 9:
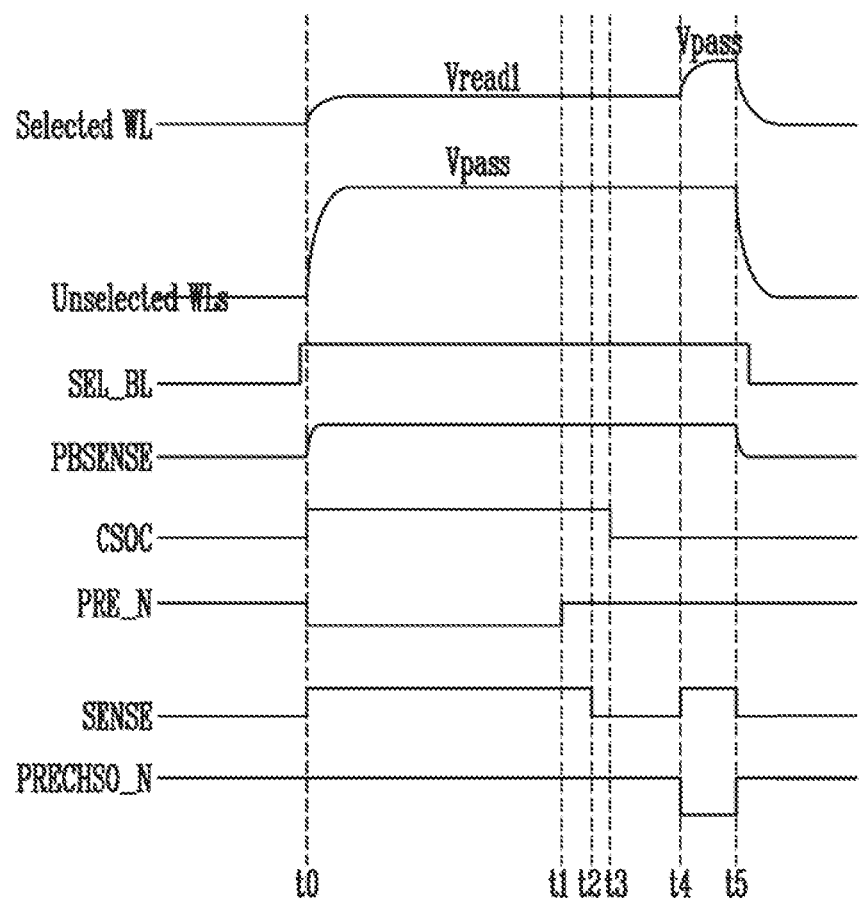
FIG. 9 is a diagram, illustrating a method for applying a channel precharge voltage to bit lines in accordance with another embodiment of the present disclosure.

FIG. 9 is a diagram illustrating a method for applying a channel precharge voltage to bit lines in accordance with another embodiment of the present disclosure.

Referring to FIGS. 4, 5, and 9, FIG. 9 illustrates another embodiment of the method for applying a channel precharge voltage to bit lines so as to prevent channel negative boosting. Unlike FIG. 8, FIG. 9 illustrates an embodiment in which the channel precharge voltage is applied to the bit lines by turning on the sensing node precharge transistor TR1, the sensing transmission transistor TR8, and the sensing transistor TR7.

Like FIG. 5, FIG. 9 illustrates, in a sensing operation on a selected word line Selected WL of a plurality of word lines, coupled to a memory block, voltages applied to the selected word line Selected WL and unselected word lines Unselected WLs and signals applied to a plurality of transistors included in each of the plurality of page buffers. FIG. 8 further illustrates a sensing node precharge signal PRECHSO_N, in addition to the signals shown in FIG. 5.

In FIG. 9, a case where a sensing operation is performed after t0 is assumed.

Referring to FIGS. 2, 4, 5, and 9, the bit line select signal SEL_BL may be a signal for turning on or turning off the bit line select transistor (i.e., the sixth transistor TR6). The sensing signal PBSENSE may be a signal for turning on or turning off the sensing transistor (i.e., the seventh transistor TR7). The precharge transmission signal CSOC may be a signal for turning on or turning off the precharge transmission transistor (i.e., the ninth transistor TR9). The precharge signal PRE_N may be a signal for turning on or turning off the precharge transistor (i.e., the third transistor TR3). The sensing transmission signal SENSE may be a signal for turning on or turning off the sensing transmission transistor (i.e., the eighth transistor TR8). The sensing node precharge signal PRECHSO_N may be a signal for turning on or turning off the sensing node precharge transistor (i.e., the first transistor TR1).

In an embodiment, the bit line select signal SEL_BL, the sensing signal PBSENSE, the precharge transmission signal CSOC, the precharge signal PRE_N, the sensing transmission signal SENSE, and the sensing node precharge signal PRECHSO_N may be bit line control signals for applying a voltage to bit lines. The bit line control signals may be outputted from the bit line control signal generator. The bit line control signal generator may be included in the memory device. In an embodiment, the bit line control signal generator may be included in the control logic of the memory device.

The bit line control signal generator may generate bit line control signals for apply a channel precharge voltage to bit lines, coupled to the respective plurality of page buffers. The bit line control signals may be signals for turning on or turning off at least one of the plurality of transistors included in each of the plurality of page buffers.

Referring to FIGS. 5 and 9, at t0 to t5, the bit line select signal SEL_BL, the sensing signal PBSENSE, the precharge transmission signal CSOC, the precharge signal PRE_N, and the sensing transmission signal SENSE, which are outputted from the bit line control signal generator, are identical to those shown in FIG. 5, and therefore, their overlapping descriptions will be omitted.

In an embodiment, after the sensing operation on the selected memory cells, coupled to the selected word line Selected WL (i.e., after t4), an operation for applying a channel precharge voltage to the bit lines may be performed.

Unlike FIG. 8, FIG. 9 illustrates a method for turning on the sensing node precharge transistor TR1 so as to apply the channel precharge voltage to the bit lines.

Specifically, after the sensing operation is performed, the control logic may control the peripheral circuit to apply the pass voltage Vpass to the selected word line Selected WL and to apply the channel precharge voltage to the bit lines while the pass voltage Vpass is being applied to the selected word line Selected WL.

In an embodiment, the channel precharge voltage may be applied to the bit lines so as to prevent channel negative boosting. When the channel precharge voltage is applied to the bit lines, channel charges are moved toward the bit lines, so that the channel negative boosting can be prevented.

In an embodiment, the bit line select signal SEL_BL may be outputted in the high state before to, to be outputted in the low state after the first read (verify) operation and the discharge of the bit lines and the word lines are completed. Therefore, the bit line select transistor TR6 may maintain the turn-on state from a time at which the sensing operation is started to a time at which the bit lines and the word lines are discharged, in response to the bit line select signal SEL_BL.

In order to apply the channel precharge voltage, i.e., the power voltage to the bit lines, the bit line control signal generator may generate the sensing transmission signal SENSE and the sensing node precharge signal PRECHSO_N. The sensing transmission signal SENSE may be a signal for turning on the sensing transmission transistor TR8, and the sensing node precharge signal PRECHSO_N may be a signal for turning on the sensing node precharge transistor TR1. The sensing transmission transistor TR8 may be an NMOS transistor, and the sensing node precharge transistor TR1 may be a PMOS transistor.

At t4 and t5, in order to apply the channel precharge voltage to the bit lines, the bit line control signal generator may generate the sensing node precharge signal PRECHSO_N in the low state. The sensing node precharge transistor TR1 may be turned on by the sensing node precharge signal PRECHSO_N in the low state. When the sensing node precharge transistor TR1 is turned on, a power voltage may be applied to the bit lines. The power voltage may be the channel precharge voltage.

While the pass voltage Vpass is being applied to the selected word line Selected WL, the bit line control signal generator may generate the sensing transmission signal SENSE in the high state and apply the sensing transmission signal SENSE in the high state to a gate of the sensing transmission transistor TR8. Furthermore, while the pass voltage Vpass is being applied to the selected word line Selected WL, the bit line control signal generator may generate the sensing node precharge signal PRECHSO_N in the low state and apply the sensing node precharge signal PRECHSO_N in the low state to a gate of the sensing node precharge transistor TR1.

Unlike FIG. 8, in FIG. 9, the sensing signal PBSENSE may maintain the high state while the pass voltage Vpass is being applied to the selected word line Selected WL. Since the sensing transistor TR7 is to be turned on so as to apply the channel precharge voltage, i.e., the power voltage to the bit lines, the sensing signal PBSENSE may maintain the high state. Therefore, while the pass voltage Vpass is being applied to the selected word line Selected WL, the bit line control signal generator may generate the sensing signal PBSENSE in the high state, which is used to turn on the sensing transistor TR7. The sensing signal PBSENSE in the high state may be applied to a gate of the sensing transistor TR7.

Consequently, when the sensing node precharge transistor TR1 is turned on, the power source and the sensing node may be coupled to each other. When the sensing transmission transistor TR8 is turned on, the sensing node and the second node may be coupled to each other. When the sensing transistor TR7 is turned on, the second node and the first node may be coupled to each other. Therefore, a current path may be formed between the second node and the first node, and the channel precharge voltage (power voltage) may be applied to the bit lines through the bit line select transistor TR6.

After t5, when the power voltage is applied to the bit lines, a channel may be precharged. Therefore, the bit lines and the word lines may be simultaneously discharged.

Conventionally, in the equalizing operation after the sensing operation, the selected word line Selected WL and the unselected word lines Unselected WLs were discharged, just after the pass voltage Vpass was applied to the selected word line Selected WL.

However, in the present disclosure, at t4 and t5, the pass voltage Vpass may be applied to the selected word line Selected WL for a certain time so as to apply the channel precharge voltage to the bit lines. While the pass voltage Vpass is being applied to the selected word line Selected WL, the voltage applied to the unselected word lines Unselected WLs may also be maintained as the pass voltage Vpass.

In an embodiment, before or after the pass voltage Vpass is applied to the selected word line Selected WL, the bit line control signal generator may generate the sensing node precharge signal PRECHSO_N in the high state. That is, the sensing node precharge transistor TR1 may be turned off, before or after the operation of applying the channel precharge voltage to the bit lines is performed.

Consequently, the channel precharge voltage is applied to the bit lines through the sensing node precharge signal PRECHSO_N, so that the channel negative boosting can be prevented. That is, in the discharge operation of the word lines after the sensing operation, the channel precharge voltage is applied to the bit lines, so that the channel potential can become a positive value. When the channel potential becomes the positive value, the channel negative boosting can be prevented.

Figure 10:
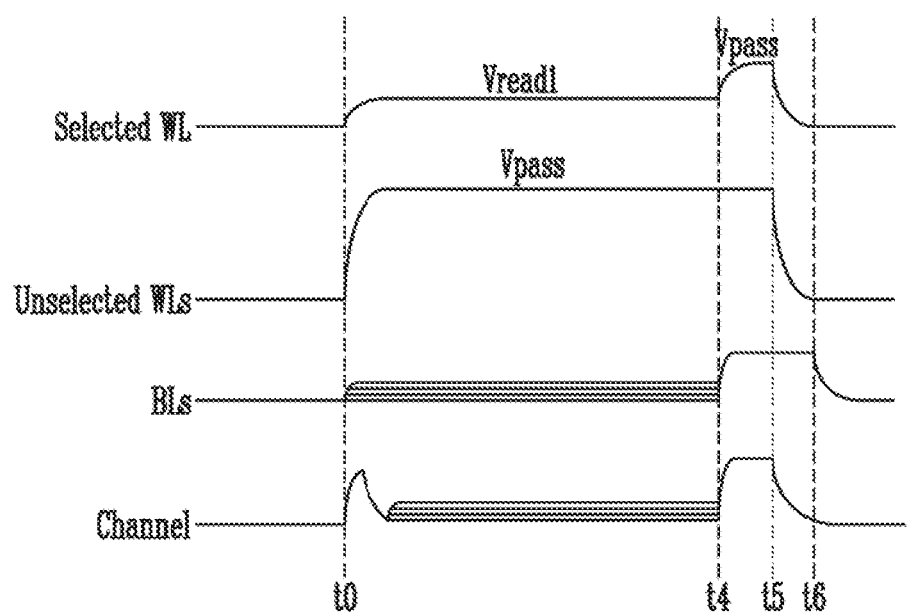
FIG. 10 is a diagram, illustrating a potential of bit lines and a channel potential, which are changed after the channel precharge voltage is applied to the bit lines.

FIG. 10 is a diagram illustrating a potential of bit lines and a channel potential, which are changed after the channel precharge voltage is applied to the bit lines.

Referring to FIGS. 8, 9, and 10, FIG. 10 illustrates a potential of bit lines BLs and a potential of the channel Channel after the channel precharge voltage is applied to the bit lines BLs in FIGS. 8 and 9. A case where t0, t4, t5, and t6 shown in FIG. 10 are the same times as t0, t4, t5, and t6 shown in FIGS. 8 and 9 is assumed. A case where the bit lines BLs shown in FIG. 10 is bit lines, coupled to selected memory cells of the selected word line Selected WL, is assumed.

In FIG. 10, between t0 to t5, voltages applied to the selected word line Selected WL and the unselected word lines Unselected WLs are identical to those shown in FIGS. 8 and 9, and therefore, their overlapping descriptions will be omitted.

In an embodiment, at t0, a precharge voltage may be applied to the bit lines BLs so as to sense the selected memory cells, coupled to the selected word line Selected WL. That is, at t0, the precharge voltage may be applied to the bit lines BLs so as to perform a sensing operation. The sensing operation may be the first read operation or first verify operation. The voltage of the bit lines BLs may be increased to a specific value.

When the precharge voltage is applied to the bit lines BLs, the voltage of the bit lines BLs may have various values based on program states of the memory cells, coupled to the selected word line Selected WL. Specifically, in the case of memory cells in a high program state of the memory cells, coupled to the selected word line Selected WL, voltages of bit lines BLs, coupled to the respective memory cells in the high program state, may have a low value. On the contrary, in the case of memory cells in a low program state of the memory cells, coupled to the selected word line Selected WL, voltages of bit lines BLs, coupled to the respective memory cells in the low program state, may have a high value.

After the sensing operation, at t4, the channel precharge voltage may be applied to the bit lines BLs. Specifically, while the pass voltage Vpass is being applied to the selected word line Selected WL, the channel precharge voltage may be applied to the bit lines BLs. While the pass voltage Vpass is being applied to the selected word line Selected WL, the voltage applied to the unselected word lines Unselected WLs may be maintained as the pass voltage Vpass. In addition, the channel precharge voltage may be applied to the bit lines BLs so as to prevent channel negative boosting.

When the channel precharge voltage is applied to the bit lines BLs, and charges trapped in the channel are moved toward the bit lines, the potential of the channel Channel may be increased. When the potential of the channel Channel is increased, the channel negative bootsing can be prevented.

In an embodiment, when the channel precharge voltage is applied to the bit lines BLs, the selected word line Selected WL and the unselected word lines Unselected WLs may be discharged (t5 and t6). When the selected word line Selected WL and the unselected word lines Unselected WLs are discharged, a new voltage may be applied to the bit lines BLs so as to perform a next operation.

When the channel precharge voltage is applied to the bit lines BLs, the potential of the channel Channel may be changed.

At t0, the potential of the channel Channel may be instantaneously increased and then again become 0V. Specifically, when the sensing operation is started, the sensing voltage may be applied to the selected word line Selected WL, and the pass voltage Vpass may be applied to the unselected word lines Unselected WLs. When the sensing voltage and the pass voltage Vpass are applied to the respective selected word line Selected WL and the respective unselected word lines Unselected WLs, channel coupling between the word lines may occur. When the channel coupling between the word lines, the potential of the channel Channel may be increased. The increased potential of the channel Channel may again become 0V after a certain time elapses.

The channel Channel of which the potential is again changed to 0V may have various potentials based on program states of the memory cells. That is, since the plurality of memory cells, coupled to the cell string, may have various program states, a current flowing in the plurality of memory cells may vary depending on a voltage applied to a word line. Consequently, the potential of the channel Channel may have various values based on program states of the plurality of memory cells, coupled to the cell string.

The potential of the channel Channel may again become 0V after the sensing operation is ended (t6). However, unlike FIG. 5, after t4, the channel negative boosting does not occur. That is, when the channel precharge voltage is applied to the bit lines BLs, the potential of the channel Channel may be increased at t4 and t5 and then again become 0V, regardless of cut-off times of the plurality of memory cells.

In an embodiment, since the channel negative boosting does not occur, the potential of the channel Channel is sequentially decreased from a positive voltage and then reaches 0V. Specifically, the potential of the channel Channel is increased at t4, when the channel precharge voltage is applied to the bit lines BLs. The increased potential of the channel Channel is maintained until t5. After t5, the potential of the channel Channel is decreased and then reaches 0V.

In addition, the voltages applied to the selected word line Selected WL and the unselected word lines Unselected WLs are discharged while the potential of the channel Channel is being decreased (t5 and t6). Thus, since the potential of the channel Channel does not have any negative value, it is unnecessary for the memory device to perform an additional operation for setting the potential of the channel Channel to 0V.

Figure 11:
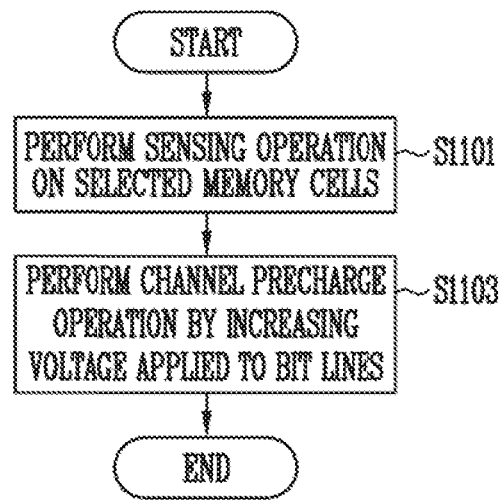
FIG. 11 is a diagram, illustrating an operation of the memory device, in accordance with an embodiment of the present disclosure.

FIG. 11 is a diagram illustrating an operation of the memory device in accordance with an embodiment of the present disclosure.

Referring to FIG. 11, in step S1101, the memory device may perform a sensing operation on selected memory cells. The sensing operation may be a read operation or verify operation. That is, the sensing operation may be an operation of reading or verifying data programmed in the selected memory cells, coupled to a selected word line. The sensing operation may be performed by applying a sensing voltage to a selected word line of a plurality of word lines, coupled to a memory block, and applying a pass voltage to unselected word lines. The sensing voltage may be a read voltage or verify voltage.

In step S1103, the memory device may perform a channel precharge operation by increasing a voltage applied to bit lines. The channel precharge operation may be an operation of applying a channel precharge voltage to bit lines, coupled the respective memory cells, coupled to the selected word line. The channel precharge operation may be performed when the plurality of word lines coupled to the memory device are discharged after the sensing operation is performed.

Figure 12:
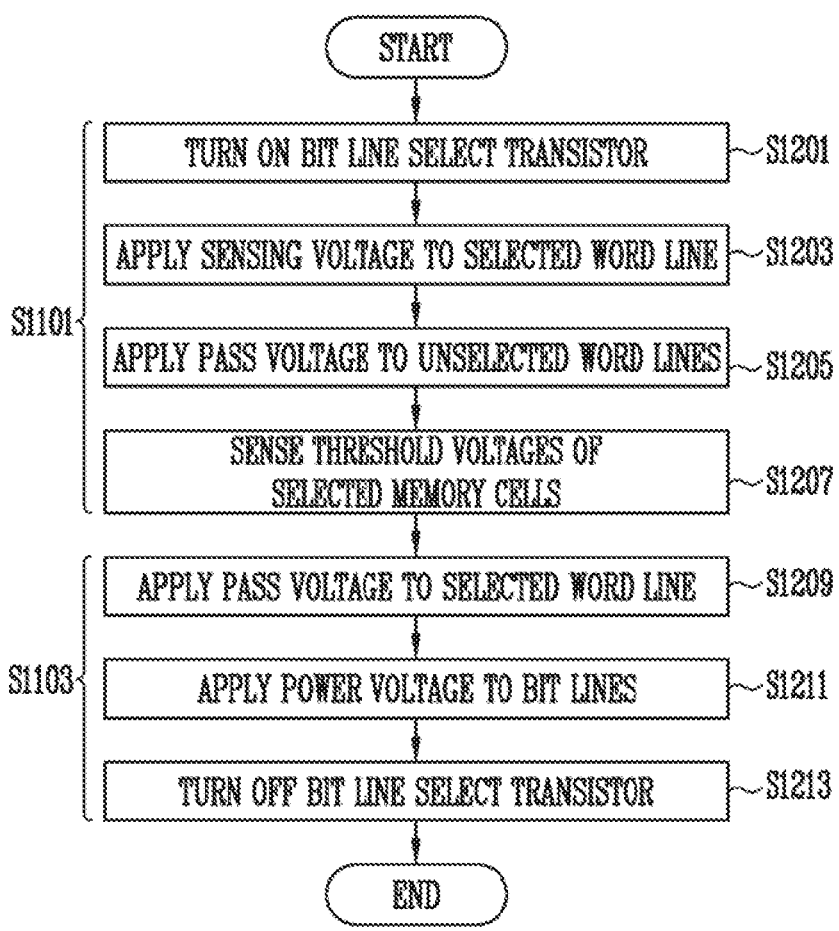
FIG. 12 is a diagram, illustrating an operation of the memory device, in accordance with an embodiment of the present disclosure.

FIG. 12 is a diagram illustrating an operation of the memory device in accordance with an embodiment of the present disclosure.

Referring to FIGS. 11 and 12, steps S1201 to S1207 are steps obtained by subdividing the step S1101. Steps S1209 to S1213 are steps obtained by subdividing the step S1103.

The steps S1201 to S1207 are steps obtained by subdividing the sensing operation on the selected memory cells.

In the step S1201, the bit line select transistor may be turned on. When the bit line select transistor is turned on, a bit line and a page buffer may be coupled to each other. The bit line select transistor may maintain the turn-on state from a time at which the sensing operation is started to a time at which the application of the channel precharge voltage to the bit lines is completed. In an embodiment, the bit line select transistor may be turned on before the sensing operation is performed, and data may be sensed through the bit line. Subsequently, the bit line select transistor may be turned off after a word line discharge, so that the bit line and the page buffer are separated from each other.

In the step S1203, a sensing voltage may be applied to a selected word line. The selected word line may be a target word line on which a sensing operation is performed. The sensing operation may be a read operation or verify operation. The sensing voltage may be a read voltage or verify voltage.

Specifically, the read voltage applied to the selected word line may be a voltage for distinguishing an erase state and a program state of selected memory cells, coupled to the selected word line. In another embodiment, the verify voltage applied to the selected word line may be a voltage for determining whether the selected memory cells, coupled to the selected word line have been programmed to a target program state.

In the step S1205, a pass voltage may be applied to unselected word lines. The unselected word lines may be word lines except the selected word line of a plurality of word lines, coupled to a memory block.

The pass voltage may be applied to the unselected word lines so as to sense data programmed in the selected memory cells, coupled to the selected word line. When the pass voltage is applied to the unselected word lines, memory cells, coupled to the respective unselected word lines, may be turned on. Thus, the data programmed in the selected memory cells, coupled to the selected word line can be sensed.

In the step S1207, threshold voltages of the selected memory cells may be sensed. Specifically, the threshold voltages of the selected memory cells may be sensed through the sensed data by applying the sensing voltage to the selected word line and sensing the selected memory cells, coupled to the selected word line. That is, a program state of the selected memory cells may be determined through the read data by applying the read voltage or verify voltage to the selected word line.

In the step S1209, the pass voltage may be applied to the selected word line. In an embodiment, an equalizing operation may be performed after the sensing operation. The equalizing operation may be an operation for discharging a plurality of word lines, coupled to memory block. The plurality of word lines, coupled to the memory block, may include a selected word line and unselected word lines. In the equalizing operation, the pass voltage may be applied to the selected word line after the sensing operation so as to simultaneously discharge the plurality of word lines.

When the pass voltage is applied to the selected word line, the selected word line and the unselected word lines may be simultaneously discharged. Thus, times at which the discharge of the plurality of word lines is completed can be equalized.

In the step S1211, a power voltage may be applied to the bit lines. In order to precharge a channel of a cell string, the power voltage may be applied to the bit lines while the pass voltage is being applied to the selected word line. The power voltage may be a channel precharge voltage for precharging the channel.

Conventionally, in the equalizing operation after the sensing operation, the selected word line and the unselected word lines were discharged just after the pass voltage was applied to the selected word line.

However, in the present disclosure, in order to apply the channel precharge voltage (power voltage) to the bit lines, the voltage applied to the unselected word lines may be maintained as the pass voltage, while the pass voltage is being applied to the selected word line. When the channel precharge voltage (power voltage) is applied to the bit lines, channel negative boosting can be prevented. That is, in a discharge operation of the word line after the sensing operation, the potential of the channel may become a positive value by applying the channel precharge voltage to the bit lines. When the potential of the channel becomes the positive value, the channel negative boosting can be prevented.

In the step S1213, the bit line select transistor may be turned off. In an embodiment, when the word lines and the bit lines are discharged after the power voltage is applied to the bit lines, the word lines and the bit lines may be in an initialization state. Thus, the bit line select transistor can be turned off until before a new sensing operation is performed.

Figure 13:
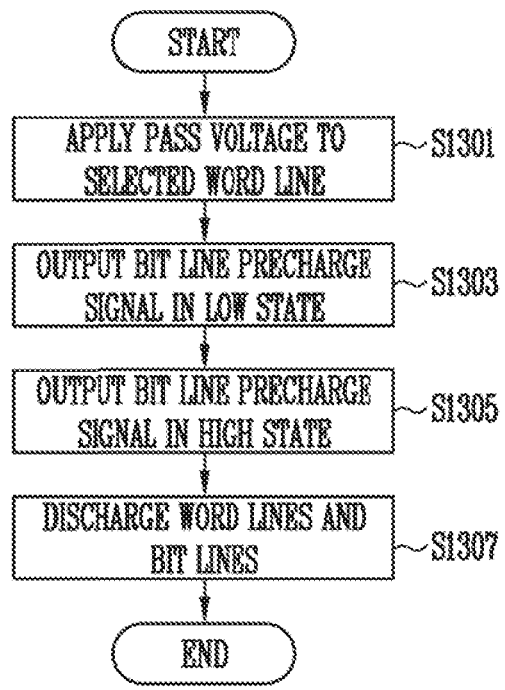
FIG. 13 is a diagram, illustrating an operation of the memory device, in accordance with an embodiment of the present disclosure.

FIG. 13 is a diagram illustrating an operation of the memory device in accordance with an embodiment of the present disclosure.

Referring to FIG. 13, in step S1301, a pass voltage may be applied to a selected word line. When the pass voltage is applied to the selected word line, an equalizing operation may be performed after a sensing operation. The equalizing operation may be an operation for allowing a plurality of word lines to be completely discharged at the same time. The pass voltage may be applied to the selected word line for a certain time. The certain time may be a time taken for a channel precharge voltage (power voltage) to be applied to a bit line. While the pass voltage is being applied to the selected word line, the voltage applied to unselected word lines may be maintained as the pass voltage.

Steps S1303 and S1305 may include operations for applying the channel precharge voltage (power voltage) to the bit line.

In the step S1303, the bit line control signal generator may output a bit line precharge signal in a low state.

In an embodiment, the bit line control signal generator may output a bit line precharge signal for turning on the bit line precharge transistor, while the pass voltage is being applied to the selected word line. The bit line precharge signal in the low state may be applied to a gate of the bit line precharge transistor. The bit line precharge transistor may be a PMOS transistor.

When the bit line precharge signal in the low state is applied to the gate of the bit line precharge transistor, the bit line precharge transistor may be turned on. When the bit line precharge transistor is turned on, the power source and the first node may be coupled to each other, so that a current path is formed. When the current path is formed between the power source and the first node, the channel precharge voltage (power voltage) may be applied to the bit line.

In the step S1305, the bit line control signal generator may output the bit line precharge signal in a high state.

In an embodiment, the bit line control signal generator may output the bit line precharge signal in the high state, which is used to turn of the bit line precharge transistor, when a plurality of word lines, coupled to a memory block, are discharged. The bit line precharge signal in the high state may be applied to the gate of the bit line precharge transistor.

When the bit line precharge signal in the high state is applied to the gate of the bit line precharge transistor, the bit line precharge transistor may be turned off. When the bit line precharge transistor is turned off, the current path between the power source and the first node may be blocked, and the channel precharge voltage (power voltage) cannot be applied to the bit line any more.

In step S1307, the word lines and the bit lines may be discharged. In an embodiment, in order to prevent channel negative boosting, the word lines and the bit lines may be simultaneously discharged, after the channel precharge voltage (power voltage) is applied to the bit lines. When the bit lines are discharged, the bit line discharge transistor may be turned on. The bit line control signal generator may output the bit line discharge signal in the high state such that the bit line discharge transistor is turned on.

When the word lines and the bit lines are simultaneously discharged, the channel negative boosting can be prevented.

Figure 14:
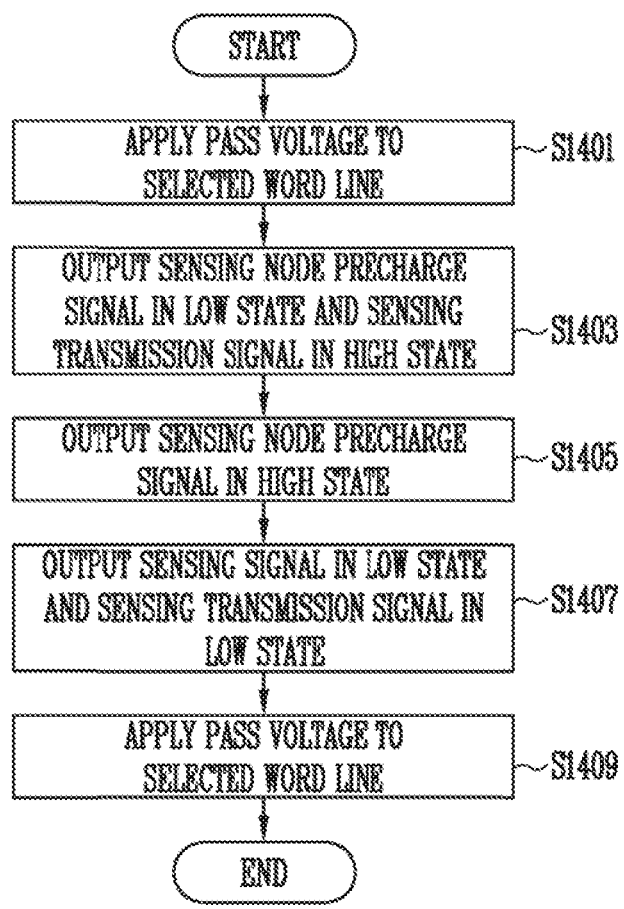
FIG. 14 is a diagram, illustrating an operation of the memory device, in accordance with an embodiment of the present disclosure.

FIG. 14 is a diagram illustrating an operation of the memory device in accordance with an embodiment of the present disclosure.

Referring to FIG. 14, in step S1401, a pass voltage may be applied to a selected word line. When the pass voltage is applied to the selected word line, an equalizing operation may be performed after a sensing operation. The equalizing operation may be an operation for allowing a plurality of word lines to be completely discharged at the same time. The pass voltage may be applied to the selected word line for a certain time. The certain time may be a time taken for a channel precharge voltage (power voltage) to be applied to a bit line. While the pass voltage is being applied to the selected word line, the voltage applied to unselected word lines may be maintained as the pass voltage.

In an embodiment, in order to apply the channel precharge voltage (power voltage) to the bit line, the sensing transistor may maintain the turn-on state until the channel precharge voltage (power voltage) is applied to the bit line.

Steps S1403 to S1407 may include operations for applying the channel precharge voltage (power voltage) to the bit line.

In the step S1403, the bit line control signal generator may output a sensing node precharge signal in a low state and a sensing transmission signal in a high state.

In an embodiment, while the pass voltage is being applied to the selected word line, the bit line control signal generator may output the sensing node precharge signal in the low state and the sensing transmission signal in the high state, which are used to turn on the sensing node precharge transistor and the sensing transmission transistor.

The sensing node precharge signal in the low state may be applied to a gate of the sensing node precharge transistor, and the sensing transmission signal in the high state may be applied to a gate of the sensing transmission transistor. The sensing node precharge transistor may be a PMOS transistor, and the sensing transmission transistor may be an NMOS transistor.

When the sensing node precharge signal in the low state and the sensing transmission signal in the high state are applied to the respective gates of the sensing node precharge transistor and the sensing transmission transistor, the sensing node precharge transistor and the sensing transmission transistor may be turned on. The sensing transistor may maintain the turn-on state.

When the sensing node precharge transistor is turned on, the power source and the sensing node may be coupled to each other, so that a current path is formed. In addition, when the sensing transmission transistor is turned on, the sensing node and the second node may be coupled to each other, so that a current path is formed. Consequently, a current path is formed of the power source, the sensing node, and the second node, so that the channel precharge voltage (power voltage) can be applied to the bit line.

In the step S1405, the bit line control signal generator may output the sensing node precharge signal in the high state.

In an embodiment, the bit line control signal generator may output the sensing node precharge signal in the high state, which is used to turn off the sensing node precharge transistor, when a plurality of word lines, coupled to a memory block, are discharged. The sensing node precharge signal in the high state may be applied to the gate of the sensing node precharge transistor.

When the sensing node precharge signal in the high state is applied to the gate of the sensing node precharge transistor, the sensing node precharge transistor may be turned on. When the sensing node precharge transistor is turned off, the current path between the power source and the sensing node is blocked, and the channel precharge voltage (power voltage) cannot be applied to the bit line any more.

In the step S1407, the bit line control signal generator may output a sensing signal in the low state and the sensing transmission signal in the low state. The sensing signal in the low state may be applied to a gate of the sensing transistor, and the sensing transmission signal in the low state may be applied to the gate of the sensing transmission transistor. When the sensing signal in the low state and the sensing transmission signal in the low state are output, the current path between the first node and the second node may be blocked, and the bit lines may be discharged.

In step S1409, the word lines and the bit lines may be discharged. In an embodiment, in order to prevent channel negative boosting, the word lines and the bit lines may be simultaneously discharged, after the channel precharge voltage (power voltage) is applied to the bit lines. When the bit lines are discharged, the bit line discharge transistor may be turned on. The bit line control signal generator may output the bit line discharge signal in the high state such that the bit line discharge transistor is turned on.

When the word lines and the bit lines are simultaneously discharged, the channel negative boosting can be prevented.

Figure 15:
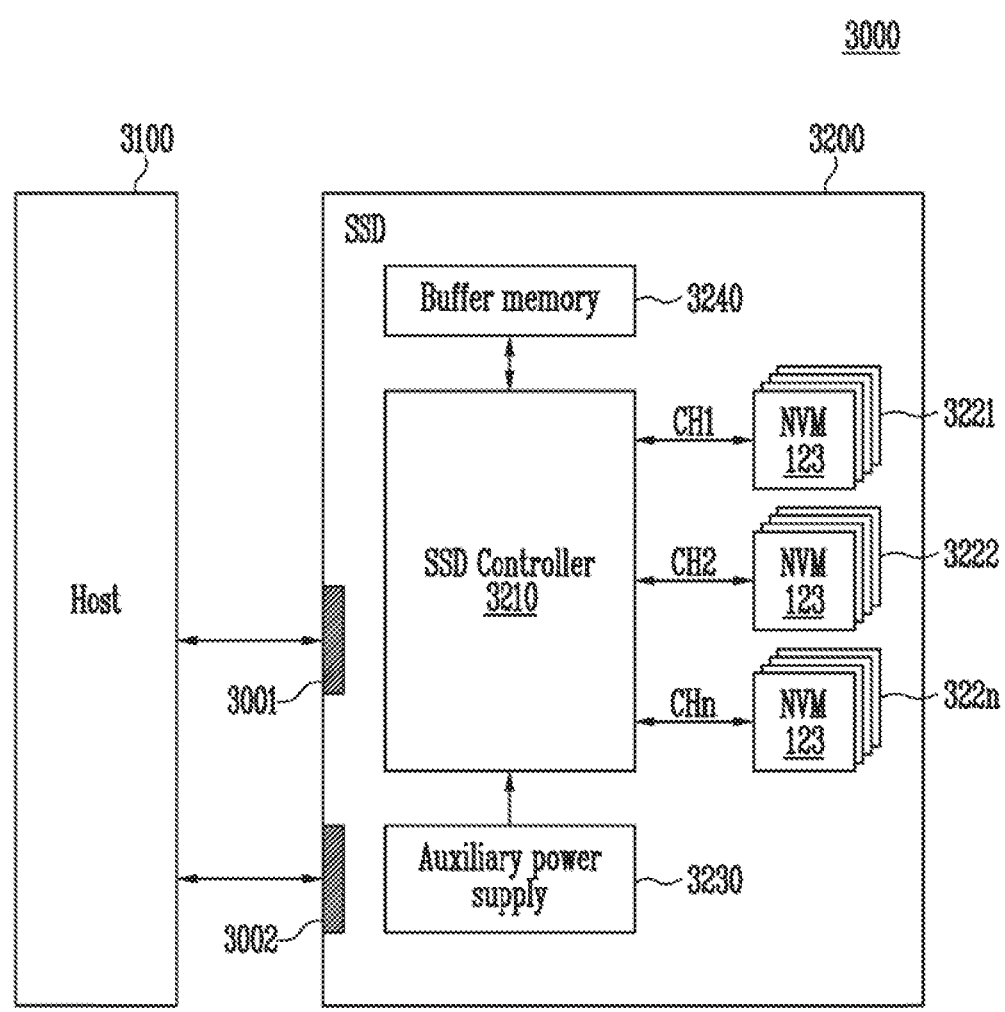
FIG. 15 is a block diagram, exemplarily illustrating a Solid State Drive (SSD) system to which the storage device is applied, in accordance with an embodiment of the present disclosure.

FIG. 15 is a block diagram exemplarily illustrating a Solid State Drive (SSD) system to which the storage device is applied in accordance with an embodiment of the present disclosure.

Referring to FIG. 15, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Referring to FIG. 2, each of the flash memories 3221 to 322n shown in FIG. 15 may include the page buffer group 123. The page buffer group 123 may include a plurality of page buffers. Each of the plurality of page buffers may include transistors for sensing or storing data. The transistors included in each page buffer may be turned on or turned off so as to apply a channel precharge voltage to a bit line, coupled to the page buffer.

Specifically, the bit line precharge transistor TR4 of the transistors included in each page buffer may be turned on such that the channel precharge voltage is applied to the bit line. Alternatively, the sensing node precharge transistor TR1, the sensing transistor TR7, and the sensing transmission transistor TR8 of the transistors included in each page buffer may be turned on.

In accordance with the present disclosure, there can be provided a memory device for applying a channel precharge voltage to a bit line to precharge a channel of a memory cell after a sensing operation, and an operating method of the memory device.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
   a memory block, coupled to a plurality of word lines;
   a peripheral circuit configured to perform a sensing operation on selected memory cells of the memory block, the selected memory cells being coupled to a selected word line of the plurality of word lines;
   a word line voltage controller configured to control a sensing voltage applied to the selected word line to perform the sensing operation on the selected memory cells and configured to control a pass voltage applied to the selected word line and unselected word lines of the plurality of word lines, coupled to the memory block; and
   a bit line control signal generator configured to control the peripheral circuit to apply a channel precharge voltage to respective bit lines, coupled to the selected memory cells, while the pass voltage is being applied to the selected word line and the unselected word lines,
   wherein the peripheral circuit includes a plurality of page buffers, coupled to the respective bit lines, and
   wherein the bit line control signal generator generates bit line control signals to turn on or turn off at least one of transistors included in each of the plurality of page buffers for controlling voltage levels of the respective bit lines.

2. The memory device of claim 1, wherein the sensing voltage is a read voltage.

3. The memory device of claim 1, wherein the sensing voltage is a verify voltage.

4. The memory device of claim 1, wherein the word line voltage controller controls the peripheral circuit to apply the pass voltage to the selected word line, after the sensing operation is performed,
   wherein, while the pass voltage is being applied to the selected word line, the bit line control signal generator controls the peripheral circuit to apply the channel precharge voltage to the bit lines.

5. The memory device of claim 4, wherein the word line voltage controller controls the peripheral circuit to maintain the pass voltage applied to the unselected word lines, while the pass voltage is being applied to the selected word line.

6. The memory device of claim 4,
   wherein each of the plurality of page buffers includes a bit line transistor component coupled to each of the bit lines and a sensing transistor component, coupled between data lines for sensing data, and
   wherein a bit line select transistor, included in the bit line transistor component, maintains a turn-on state from a time at which the sensing operation is started to a time at which the application of the channel precharge voltage to the bit lines is completed.

7. The memory device of claim 6, wherein the bit line transistor component includes:
   the bit line select transistor, coupled between a first node and a bit line, the bit line being coupled to one of the plurality of page buffers and the first node;
   a bit line precharge transistor, coupled between a power source and the first node; and
   a bit line discharge transistor, coupled between the first node and a ground,
   wherein the sensing transistor component includes:
   a sensing node precharge transistor, coupled between the power source and a sensing node;
   a sensing transmission transistor, coupled between the sensing node and a second node;
   a sensing transistor, coupled between the first node and the second node;
   a data transmission transistor, coupled between the power source and a third node;
   a precharge transmission transistor, coupled between the second node and the third node; and
   a precharge transistor, coupled between the third node and the sensing node.

8. The memory device of claim 7, wherein, when the sensing operation is performed, the bit line control signal generator controls the peripheral circuit to turn on or turn off the data transmission transistor, the precharge transmission transistor, and the precharge transistor.

9. The memory device of claim 8, wherein the bit line control signal generator generates a bit line precharge signal to turn on the bit line precharge transistor while the pass voltage is being applied to the selected word line.

10. The memory device of claim 9, wherein the bit line precharge transistor is a PMOS transistor, and
    wherein the bit line control signal generator generates the bit line precharge signal in a low state and applies the bit line precharge signal, in the low state, to a gate of the bit line precharge transistor, while the pass voltage is being applied to the selected word line.

11. The memory device of claim 10, wherein a sensing signal, for turning on the sensing transistor, maintains a high state while the pass voltage is being applied to the selected word line.

12. The memory device of claim 11, wherein the bit line control signal generator generates a sensing transmission signal, for turning on the sensing transmission transistor, and a sensing node precharge signal, for turning on the sensing node precharge transistor.

13. The memory device of claim 12, wherein the sensing transmission transistor is an NMOS transistor, and the sensing node precharge transistor is a PMOS transistor,
    wherein, while the pass voltage is being applied to the selected word line, the bit line control signal generator generates the sensing transmission signal, in the high state, and then applies the sensing transmission signal in the high state to a gate of the sensing transmission transistor, and
    wherein, while the pass voltage is being applied to the selected word line, the bit line control signal generator generates the sensing node precharge signal in the low state and then applies the sensing node precharge signal in the low state to a gate of the sensing node precharge transistor.

14. A method for operating a memory device including a memory block, coupled to a plurality of word lines, the method comprising:
    performing a sensing operation by applying a sensing voltage to a selected word line of the plurality of word lines and applying a pass voltage to unselected word lines; and
    performing a channel precharge operation by applying the pass voltage to the selected word line and applying a channel precharge voltage to bit lines that are coupled to memory cells, the memory cells being coupled to the selected word line,
    wherein the memory device includes a plurality of page buffers, coupled to the respective bit lines, and
    wherein the performing of the channel precharge operation further includes generating bit line control signals to turn on or turn off at least one of transistors included in each of the plurality of page buffers for controlling voltage levels of the respective bit lines.

15. The method of claim 14, wherein the sensing voltage is a read voltage or a verify voltage.

16. The method of claim 14, wherein, the application of the pass voltage to the unselected word lines is maintained throughout a full duration of the channel precharge operation.

17. The method of claim 14,
wherein each of the plurality of page buffers includes:
a bit line select transistor, coupled between a first node and a bit line, the bit line being, coupled to one of the plurality of page buffers and the first node;
a bit line precharge transistor, coupled between a power source and the first node;
a bit line discharge transistor, coupled between the first node and a ground;
a sensing node precharge transistor, coupled between the power source and a sensing node;
a sensing transmission transistor, coupled between the sensing node and a second node;
a sensing transistor, coupled between the first node and the second node;
a data transmission transistor, coupled between the power source and a third node;
a precharge transmission transistor, coupled between the second node and the third node; and
a precharge transistor, coupled between the third node and the sensing node, and wherein, in the applying of the pass voltage to the selected word line, the bit line select transistor maintains a turn-on state from a time at which the sensing operation is started to a time at which the application of the channel precharge voltage to the bit lines is completed.

18. The method of claim 17, wherein the bit line precharge transistor is a PMOS transistor, and
wherein, in generating the bit line control signals, a bit line precharge signal is generated in a low state and then applied, in the low state, to a gate of the bit line precharge transistor, while the pass voltage is being applied to the selected word line.

19. The method of claim 17, wherein the sensing transmission transistor is an NMOS transistor, and the sensing node precharge transistor is a PMOS transistor,
wherein, in generating the bit line control signals, a sensing transmission signal is generated in a high state and then applied, in the high state, to a gate of the sensing transmission transistor, while the pass voltage is being applied to the selected word line, and
wherein, in generating the bit line control signals, a sensing node precharge signal is generated in a low state and then applied, in the low state, to a gate of the sensing node precharge transistor, while the pass voltage is being applied to the selected word line.

* * * * *